United States Patent
Yasukawa et al.

(10) Patent No.: US 7,960,912 B2
(45) Date of Patent: Jun. 14, 2011

(54) LIGHT-EMITTING DEVICE THAT INCLUDES A PLURALITY OF LIGHT-EMITTING LAYERS STACKED ON TOP OF EACH OTHER, DISPLAY, AND ELECTRONIC APPARATUS

(75) Inventors: Koji Yasukawa, Suwa (JP); Masayuki Mitsuya, Chino (JP); Hidetoshi Yamamoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 345 days.

(21) Appl. No.: 12/189,926

(22) Filed: Aug. 12, 2008

(65) Prior Publication Data

US 2009/0091250 A1    Apr. 9, 2009

(30) Foreign Application Priority Data

Oct. 3, 2007  (JP) ................................. 2007-260408

(51) Int. Cl.
*H05B 33/00* (2006.01)
*H01L 21/00* (2006.01)
*G09G 3/30* (2006.01)

(52) U.S. Cl. .......... 313/506; 313/501; 313/507; 345/76; 428/690; 428/917

(58) Field of Classification Search .......... 313/501–512; 428/690

See application file for complete search history.

(56) References Cited

U.S. PATENT DOCUMENTS

| | | | | |
|---|---|---|---|---|
| 2001/0031509 A1 * | 10/2001 | Yamazaki | ..................... | 438/48 |
| 2005/0077817 A1 * | 4/2005 | Yamazaki et al. | ............ | 313/504 |
| 2005/0118456 A1 * | 6/2005 | Hamada et al. | ............... | 428/690 |
| 2005/0264174 A1 * | 12/2005 | Liao et al. | ..................... | 313/500 |
| 2006/0227079 A1 * | 10/2006 | Kashiwabara | .................. | 345/76 |
| 2007/0241676 A1 * | 10/2007 | Park et al. | ..................... | 313/506 |

FOREIGN PATENT DOCUMENTS

| | | |
|---|---|---|
| EP | 1786242 A1 * | 5/2007 |
| JP | A-2005-100921 | 4/2005 |

* cited by examiner

*Primary Examiner* — Nimeshkumar D Patel
*Assistant Examiner* — Tracie Green
(74) *Attorney, Agent, or Firm* — Oliff & Berridge, PLC

(57) ABSTRACT

A light-emitting device includes a cathode, an anode, a first light-emitting layer that is disposed between the cathode and the anode and that emits light of a first color, a second light-emitting layer that is disposed between the first light-emitting layer and the cathode and that emits light of a second color different from the first color, and an intermediate layer that is disposed between and in contact with the first light-emitting layer and the second light-emitting layer and that functions to prevent energy transfer of excitons between the first light-emitting layer and the second light-emitting layer. The intermediate layer includes a first intermediate layer disposed in contact with the first light-emitting layer and mainly containing a first intermediate material and a second intermediate layer disposed in contact with the second light-emitting layer and mainly containing a second intermediate material different from the first intermediate material.

14 Claims, 7 Drawing Sheets

LIGHT-EMITTING DEVICE THAT INCLUDES A PLURALITY OF LIGHT-EMITTING LAYERS STACKED ON TOP OF EACH OTHER, DISPLAY, AND ELECTRONIC APPARATUS

BACKGROUND

1. Technical Field

The present invention relates to light-emitting devices, displays, and electronic apparatuses.

2. Related Art

An organic electroluminescent (EL) device is a light-emitting device including at least one organic light-emitting layer between an anode and a cathode. In this type of light-emitting device, an electric field is applied between the anode and the cathode to inject electrons from the cathode into the light-emitting layer and holes from the anode into the light-emitting layer. The electrons and the holes then recombine together in the light-emitting layer to generate excitons. When the excitons return to the ground state, their energy is released in the form of light.

One such light-emitting device includes three light-emitting layers, corresponding to red (R), green (G), and blue (B), that are stacked between the anode and the cathode so that the device can emit white light (for example, see JP-A-2005-100921 (Patent Document 1)). This white light-emitting device can be used in combination with red (R), green (G), and blue (B) color filters provided in individual pixels to display a full-color image.

The light-emitting device according to Patent Document 1 further includes an intermediate layer between the light-emitting layers to prevent energy transfer of excitons between the light-emitting layers. This enables white light emission with a good balance of light emission among the light-emitting layers.

The light-emitting device according to Patent Document 1, however, has a problem in that it is difficult to efficiently inject carriers (electrons and holes) into the light-emitting layers while providing high durability because the intermediate layer has a monolayer structure.

SUMMARY

An advantage of some aspects of the invention is that it provides a light-emitting device that includes a plurality of light-emitting layers stacked on top of each other and that provides a good balance of light emission among the light-emitting layers while having high durability and high light-emission efficiency, a reliable display including the light-emitting device, and a reliable electronic apparatus including the display.

A light-emitting device according to an aspect of the invention includes a cathode, an anode, a first light-emitting layer that is disposed between the cathode and the anode and that emits light of a first color, a second light-emitting layer that is disposed between the first light-emitting layer and the cathode and that emits light of a second color different from the first color, and an intermediate layer that is disposed between and in contact with the first light-emitting layer and the second light-emitting layer and that functions to prevent energy transfer of excitons between the first light-emitting layer and the second light-emitting layer. The intermediate layer includes a first intermediate layer disposed in contact with the first light-emitting layer and mainly containing a first intermediate material and a second intermediate layer disposed in contact with the second light-emitting layer and mainly containing a second intermediate material different from the first intermediate material.

With appropriately selected first and second intermediate materials, the intermediate layer allows a good balance of light emission among the light-emitting layers to be achieved.

In particular, if the combination of the first and second intermediate materials is a combination of a material with a high carrier-transportation capability (electron-transportation capability and/or hole-transportation capability) and a material with a high tolerance to carriers, the intermediate layer allows a good balance of light emission among the light-emitting layers to be achieved, as described above, while providing high durability and high light-emission efficiency.

In the light-emitting device according to the above aspect of the invention, the energy level of the highest occupied molecular orbital of the first or second intermediate material is preferably higher than that of the material of the first light-emitting layer.

In this case, the first or second intermediate layer can limit the number of holes traveling from the first light-emitting layer to the second light-emitting layer, thus allowing a good balance of light emission between the first and second light-emitting layers to be achieved.

In the light-emitting device according to the above aspect of the invention, the energy levels of the highest occupied molecular orbitals of the first and second intermediate materials preferably lie between the energy levels of the highest occupied molecular orbitals of the first and second light-emitting layers.

In this case, the intermediate layer can alleviate the energy gap between the highest occupied molecular orbitals of the first and second light-emitting layers (i.e., lower the barrier of the energy gap) to reduce the drive voltage of the light-emitting device.

In the light-emitting device according to the above aspect of the invention, preferably, the energy level of the highest occupied molecular orbital of the first intermediate material is higher than that of the material of the first light-emitting layer, and the difference between the energy levels of the highest occupied molecular orbitals of the first intermediate material and the material of the first light-emitting layer is 0.1 to 0.4 eV.

In this case, a good balance of light emission between the first and second light-emitting layers can be achieved while reducing the drive voltage of the light-emitting device.

In the light-emitting device according to the above aspect of the invention, the energy level of the lowest unoccupied molecular orbital of the first or second intermediate material is preferably lower than that of the material of the second light-emitting layer.

In this case, the first or second intermediate layer can limit the number of electrons traveling from the second light-emitting layer to the first light-emitting layer, thus allowing a good balance of light emission between the first and second light-emitting layers to be achieved.

In the light-emitting device according to the above aspect of the invention, the energy levels of the lowest unoccupied molecular orbitals of the first and second intermediate materials preferably lie between the energy levels of the lowest unoccupied molecular orbitals of the first and second light-emitting layers.

In this case, the intermediate layer can alleviate the energy gap between the lowest unoccupied molecular orbitals of the first and second light-emitting layers (i.e., lower the barrier of the energy gap) to reduce the drive voltage of the light-emitting device.

In the light-emitting device according to the above aspect of the invention, preferably, the energy level of the lowest unoccupied molecular orbital of the second intermediate material is lower than that of the material of the second light-emitting layer, and the difference between the energy levels of the lowest unoccupied molecular orbitals of the second intermediate material and the material of the second light-emitting layer is 0.1 to 0.4 eV.

In this case, a good balance of light emission between the first and second light-emitting layers can be achieved while reducing the drive voltage of the light-emitting device.

In the light-emitting device according to the above aspect of the invention, the energy gap between the lowest unoccupied molecular orbital and the highest occupied molecular orbital of the first intermediate material is preferably larger than that of the first light-emitting layer.

In this case, the energy of excitons generated by the first light-emitting layer can be prevented from being transferred to the first intermediate layer. This results in a good balance of light emission between the first and second light-emitting layers.

In the light-emitting device according to the above aspect of the invention, the energy gap between the lowest unoccupied molecular orbital and the highest occupied molecular orbital of the second intermediate material is preferably larger than that of the second light-emitting layer.

In this case, the energy of excitons generated by the second light-emitting layer can be prevented from being transferred to the second intermediate layer. This results in a good balance of light emission between the first and second light-emitting layers.

In the light-emitting device according to the above aspect of the invention, the first intermediate layer preferably has a higher hole-transportation capability than the second intermediate layer.

In this case, holes can be smoothly conveyed from the first light-emitting layer to the second light-emitting layer through the intermediate layer.

In the light-emitting device according to the above aspect of the invention, the first intermediate material preferably contains an amine-based hole-transporting material.

An amine-based hole-transporting material has a high hole-transportation capability. The use of such a hole-transporting material as the first intermediate material allows holes to be significantly smoothly conveyed from the first light-emitting layer to the second light-emitting layer through the intermediate layer.

In the light-emitting device according to the above aspect of the invention, the second intermediate layer preferably has a higher electron-transportation capability than the first intermediate layer.

In this case, electrons can be smoothly conveyed from the second light-emitting layer to the first light-emitting layer through the intermediate layer.

In the light-emitting device according to the above aspect of the invention, the second intermediate material preferably contains an acene-based bipolar material.

An acene-based bipolar material has a high carrier-transportation capability (electron-transportation capability and hole-transportation capability) and a high tolerance to carriers. The use of such a bipolar material as the second intermediate material allows holes to be significantly smoothly conveyed from the first light-emitting layer to the second light-emitting layer through the intermediate layer and also allows electrons to be significantly smoothly conveyed from the second light-emitting layer to the first light-emitting layer through the intermediate layer 7. In addition, the use of the bipolar material improves the carrier tolerance of the second intermediate layer.

In the light-emitting device according to the above aspect of the invention, the intermediate layer preferably further includes a third intermediate layer disposed between and in contact with the first intermediate layer and the second intermediate layer and containing a third intermediate material different from the first and second intermediate materials.

With appropriately selected first, second, and third intermediate materials, the intermediate layer allows a good balance of light emission between the first and second light-emitting layers to be achieved. This extends the range of choice of materials that can be used for the light-emitting device, thus providing high flexibility in the design of the light-emitting device.

In the light-emitting device according to the above aspect of the invention, the energy level of the highest occupied molecular orbital of the third intermediate material preferably lies between the energy levels of the highest occupied molecular orbitals of the first and second intermediate materials.

In this case, holes can be smoothly conveyed from the first intermediate layer to the second intermediate layer through the third intermediate layer.

In the light-emitting device according to the above aspect of the invention, the energy level of the lowest unoccupied molecular orbital of the third intermediate material preferably lies between the energy levels of the lowest unoccupied molecular orbitals of the first and second intermediate materials.

In this case, electrons can be smoothly conveyed from the second intermediate layer to the first intermediate layer through the third intermediate layer.

The light-emitting device according to the above aspect of the invention preferably further includes a third light-emitting layer that is disposed between the first light-emitting layer and the anode or between the second light-emitting layer and the cathode and that emits light of a third color different from the first and second colors.

In this case, the light-emitting device can emit, for example, white light by combining red (R) light, green (G) light, and blue (B) light.

In the light-emitting device according to the above aspect of the invention, preferably, the third light-emitting layer is disposed between the second light-emitting layer and the cathode, the first light-emitting layer is a red light-emitting layer that emits red light as the light of the first color, the second light-emitting layer is a blue light-emitting layer that emits blue light as the light of the second color, and the third light-emitting layer is a green light-emitting layer that emits green light as the light of the third color.

In this case, the light-emitting device can emit white light with a good balance of light emission among the first to third light-emitting layers while having significantly high durability and current efficiency.

In the light-emitting device according to the above aspect of the invention, the intermediate layer preferably has an average thickness of 100 nm or less.

In this case, a good balance of light emission between the first and second light-emitting layers can be achieved while reducing the drive voltage of the light-emitting device.

In the light-emitting device according to the above aspect of the invention, the first and second intermediate layers preferably each have an average thickness of 1 to 50 nm.

In this case, a good balance of light emission between the first and second light-emitting layers can be achieved while reducing the drive voltage of the light-emitting device.

It is preferable that a display include the light-emitting device according to the above aspect of the invention.

In this case, a reliable display can be provided.

It is preferable that an electronic apparatus include the above display.

In this case, a reliable electronic apparatus can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Light-emitting devices, displays, and electronic apparatuses according to preferred embodiments of the invention will now be described with reference to the attached drawings.

First Embodiment

Figure 1:
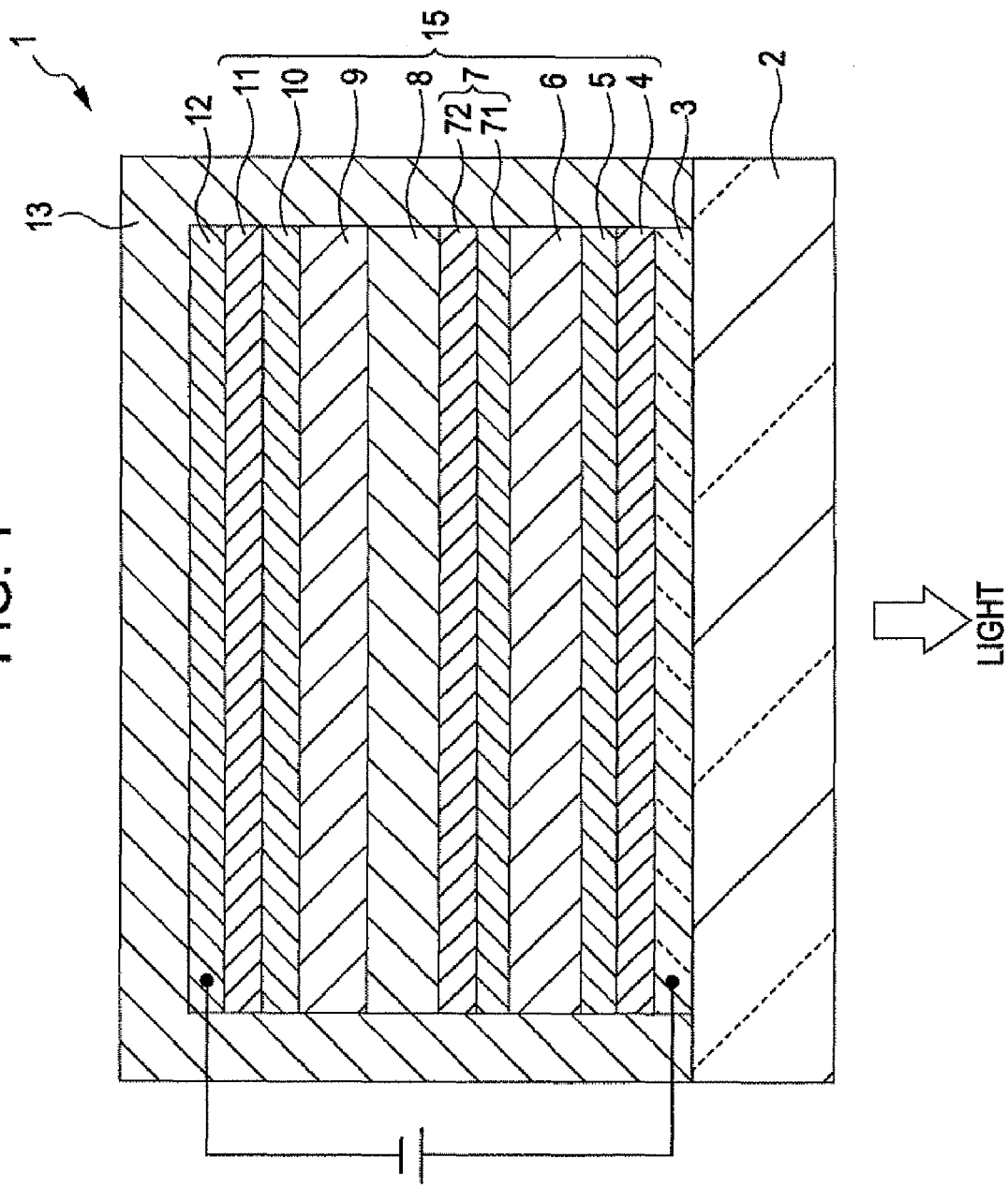
FIG. 1 is a longitudinal sectional view schematically showing a light-emitting device according to a first embodiment of the invention.
Figure 2:
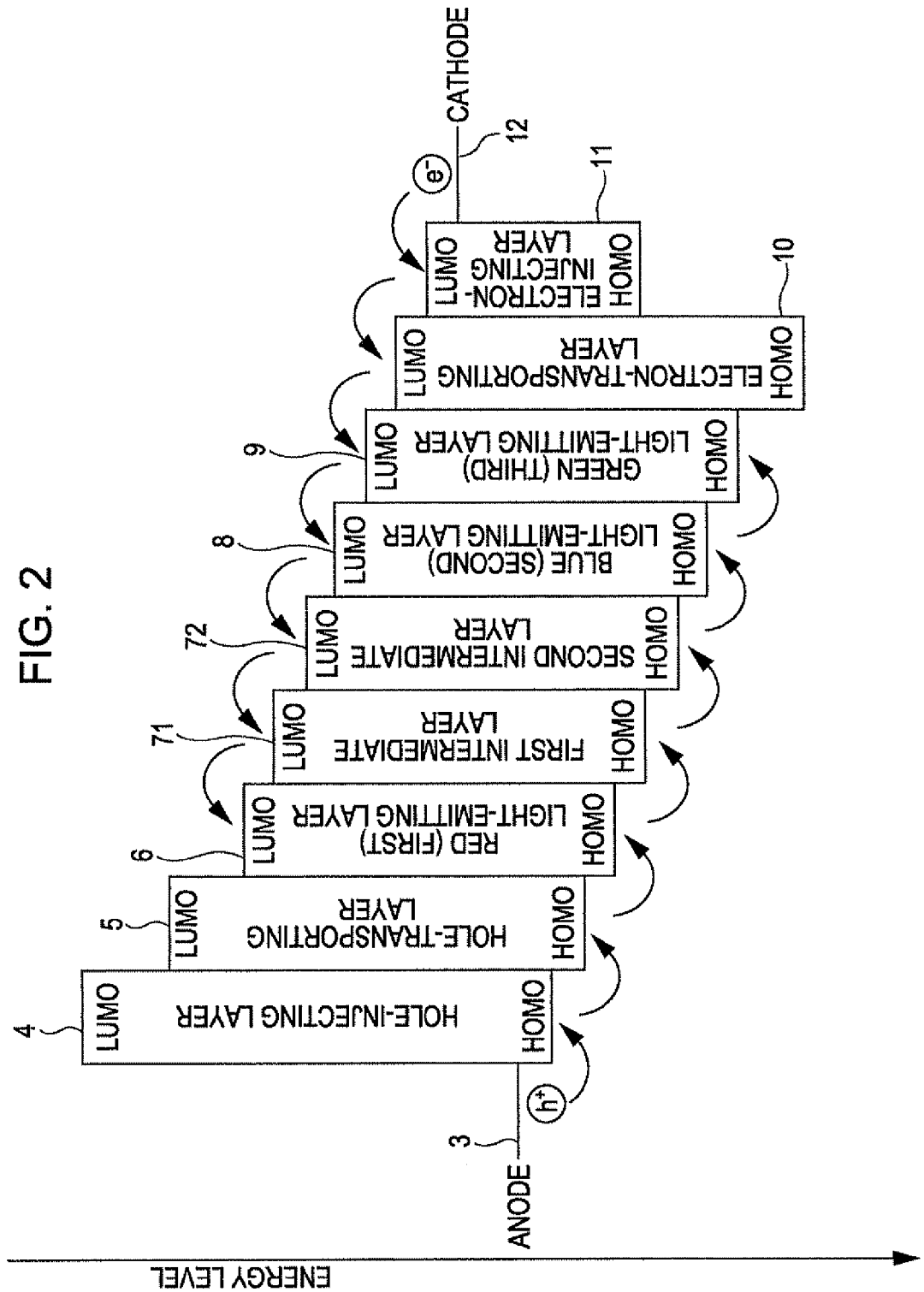
FIG. 2 is a diagram illustrating the energy levels of individual layers of the light-emitting device shown in FIG. 1.

FIG. 1 is a longitudinal sectional view schematically showing a light-emitting device according to a first embodiment of the invention. FIG. 2 is a diagram illustrating the energy levels of individual layers of the light-emitting device shown in FIG. 1. For convenience of illustration, the top of FIG. 1 is referred to as the "top" of the device, whereas the bottom of FIG. 1 is referred to as the "bottom" of the device.

Referring to FIG. 1, a light-emitting device (EL device) 1 emits white light by combining red (R) light, green (G) light, and blue (B) light.

The light-emitting device 1 includes an anode 3, a hole-injecting layer 4, a hole-transporting layer 5, a red light-emitting layer (first light-emitting layer) 6, an intermediate layer 7, a blue light-emitting layer (second light-emitting layer) 8, a green light-emitting layer (third light-emitting layer) 9, an electron-transporting layer 10, an electron-injecting layer 11, and a cathode 12 that are stacked in the above order.

In other words, the light-emitting device 1 includes a laminate 15 formed between the two electrodes (the anode 3 and the cathode 12) by stacking the hole-injecting layer 4, the hole-transporting layer 5, the red light-emitting layer 6, the intermediate layer 7, the blue light-emitting layer 8, the green light-emitting layer 9, the electron-transporting layer 10, and the electron-injecting layer 11 in the above order.

The entire light-emitting device 1 is disposed on a substrate 2 and is sealed by a sealing member 13.

In the light-emitting device 1, electrons are supplied (injected) from the cathode 12 into the light-emitting layers 6, 8, and 9, whereas holes are supplied (injected) from the anode 3 into the light-emitting layers 6, 8, and 9. In the light-emitting layers 6, 8, and 9, the electrons and the holes recombine together to release energy, thereby generating excitons. When the excitons return to the ground state, their energy (fluorescence or phosphorescence) is released (emitted). The light-emitting device 1 thus emits white light.

The substrate 2 supports the anode 3. The light-emitting device 1 according to this embodiment is configured so that light exits from the substrate 2 (bottom-emission structure), and hence the substrate 2 and the anode 3 are substantially transparent (colorless transparent, colored transparent, or translucent).

Examples of the material of the substrate 2 include resin materials such as polyethylene terephthalate, polyethylene naphthalate, polypropylene, cycloolefin polymer, polyamide, polyethersulfone, poly(methyl methacrylate), polycarbonate, and polyarylate; and glass materials such as quartz glass and soda glass. These materials may be used alone or in combination of two or more.

The average thickness of the substrate 2 is preferably, but not limited to, about 0.1 to 30 mm, more preferably about 0.1 to 10 mm.

If the light-emitting device 1 is configured so that light exits from the side opposite the substrate 2 (top-emission structure), the substrate 2 may be either a transparent substrate or a nontransparent substrate.

Examples of nontransparent substrates include ceramic substrates such as alumina substrates; metal substrates, such as stainless steel substrates, coated with oxide films (insulating films); and resin substrates.

The components of the light-emitting device 1 will now be sequentially described.

Anode

The anode 3 is an electrode for injecting holes into the hole-transporting layer 5 through the hole-injecting layer 4, as described below. The anode 3 is preferably formed of a material with a high work function and good conductivity.

Examples of the material of the anode 3 include oxides such as indium tin oxide (ITO), indium zinc oxide (IZO), $In_2O_3$, $SnO_2$, antimony-containing $SnO_2$, and aluminum-containing ZnO; and metals such as gold, platinum, silver, copper, and alloys thereof. These materials may be used alone or in combination of two or more.

The average thickness of the anode 3 is preferably, but not limited to, about 10 to 200 nm, more preferably about 50 to 150 nm.

Cathode

The cathode 12 is an electrode for injecting electrons into the electron-transporting layer 10 through the electron-injecting layer 11, as described below. The cathode 12 is preferably formed of a material with a low work function.

Examples of the material of the cathode 12 include lithium, magnesium, calcium, strontium, lanthanum, cerium, erbium, europium, scandium, yttrium, ytterbium, silver, copper, aluminum, cesium, rubidium, and alloys thereof. These materials may be used alone or in combination of two or more (for example, in the form of a laminate of different layers).

In particular, if an alloy is used as the material of the cathode 12, the alloy used is preferably an alloy containing a stable metal element such as silver, aluminum, or copper, for example, magnesium-silver alloy, aluminum-lithium alloy, or copper-lithium alloy. The use of such an alloy as the material of the cathode 12 improves the electron-injection efficiency and stability of the cathode 12.

The average thickness of the cathode 12 is preferably, but not limited to, about 100 to 10,000 nm, more preferably about 200 to 500 nm.

The cathode 12 does not have to be transparent because the light-emitting device 1 according to this embodiment has the bottom-emission structure.

Hole-Injecting Layer

The hole-injecting layer 4 functions to improve the efficiency of hole injection from the anode 3.

Examples of the material (hole-injecting material) of the hole-injecting layer 4 include, but not limited to, copper phthalocyanine and 4,4',4"-tris(N,N-phenyl-3-methylphenylamino)triphenylamine (m-MTDATA).

The average thickness of the hole-injecting layer 4 is preferably, but not limited to, about 5 to 150 nm, more preferably about 10 to 100 nm.

The hole-injecting layer 4 may be omitted.

Hole-Transporting Layer

The hole-transporting layer 5 functions to transport holes injected from the anode 3 through the hole-injecting layer 4 to the red light-emitting layer 6.

Examples of the material of the hole-transporting layer 5 include various p-type polymer materials and various p-type low-molecular-weight materials. These materials may be used alone or in combination.

Examples of p-type polymer materials (organic polymers) include polymers having an arylamine backbone (e.g., polyarylamine), polymers having a fluorene backbone (e.g., fluorene-bithiophene copolymer), polymers having both an arylamine backbone and a fluorene backbone (e.g., fluorene-arylamine copolymer), poly(N-vinylcarbazole), polyvinylpyrene, polyvinylanthracene, polythiophene, polyalkylthiophene, polyhexylthiophene, poly(p-phenylenevinylene), polythienylenevinylene, pyreneformaldehyde resin, ethylcarbazole-formaldehyde resin, and derivatives thereof.

These p-type polymer materials may also be used as a mixture with another compound. An example of such a mixture is poly(3,4-ethylenedioxythiophene/styrenesulfonic acid) (PEDOT/PSS), a mixture containing polythiophene.

Examples of p-type low-molecular-weight materials include arylcycloalkanes such as 1,1-bis(4-di-p-tolylaminophenyl)cyclohexane and 1,1'-bis(4-di-p-tolylaminophenyl)-4-phenyl-cyclohexane; arylamines such as 4,4',4"-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-bis(1-naphthyl)-N,N'-diphenyl-1,1'-biphenyl-4,4'-diamine (α-NPD), and TPTE; phenylenediamines such as N,N,N',N'-tetraphenyl-p-phenylenediamine, N,N,N',N'-tetrap-tolyl)-p-phenylenediamine, and N,N,N',N'-tetra(m-tolyl)-m-phenylenediamine (PDA); carbazoles such as carbazole, N-isopropylcarbazole, and N-phenylcarbazole; stilbenes such as stilbene and 4-di-p-tolylaminostilbene; oxazoles such as $O_xZ$; triphenylmethanes such as triphenylmethane and m-MTDATA; pyrazolines such as 1-phenyl-3-(p-dimethylaminophenyl)pyrazoline; benzins (cyclohexadienes); triazoles such as triazole; imidazoles such as imidazole; oxadiazoles such as 1,3,4-oxadiazole and 2,5-di(4-dimethylaminophenyl)-1,3,4, -oxadiazole; anthracenes such as anthracene and 9-(4-diethylaminostyryl)anthracene; fluorenones such as fluorenone, 2,4,7, -trinitro-9-fluorenone, and 2,7-bis(2-hydroxy-3-(2-chlorophenylcarbamoyl)-1-naphthylazo)fluorenone; anilines such as polyaniline; silanes; pyrroles such as 1,4-dithioketo-3,6-diphenyl-pyrrolo-(3,4-c)pyrrolopyrrole; fluorenes such as fluorene; porphyrins such as porphyrin and metal tetraphenylporphyrins; quinacridones such as quinacridone; metal or nonmetal phthalocyanines such as phthalocyanine, copper phthalocyanine, tetra(t-butyl) copper phthalocyanine, and iron phthalocyanine; metal or nonmetal naphthalocyanines such as copper naphthalocyanine, vanadyl naphthalocyanine, and monochlorogallium naphthalocyanine; and benzidines such as N,N'-di(naphthalen-1-yl)-N,N'-diphenyl-benzidine and N,N,N',N'-tetraphenylbenzidine.

Of these, a material mainly containing a p-type low-molecular-weight material is preferred as the material of the hole-transporting layer 5. In this case, the hole-transporting layer 5 can readily be formed as a uniform thin film by a vapor deposition process such as vacuum deposition. In addition, the red light-emitting layer 6 can also be formed as a uniform thin film on the uniform hole-transporting layer 5 by a vapor deposition process such as vacuum deposition. Hence, a light-emitting device with superior characteristics and no variations in light emission can be produced in high yield. The average thickness of the hole-transporting layer 5 is preferably, but not limited to, about 10 to 150 nm, more preferably about 10 to 100 nm.

The hole-transporting layer 5 may be omitted.

Red Light-Emitting Layer

The red light-emitting layer (first light-emitting layer) 6 contains a red light-emitting material that emits red light (first color).

The red light-emitting material used is not particularly limited. Examples of the red light-emitting material include various red fluorescent materials and various red phosphorescent materials. These materials may be used alone or in combination of two or more.

The red fluorescent material used may be any material that emits red fluorescence. Examples of the red fluorescent material include perylene derivatives, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H, 5H-benzo(ij)quinolizin-9-yl) ethenyl)-4H-pyran-4H-ylidene)propanedinitrile (DCJTB), 4-(dicyanomethylene)-2-methyl-6-(p-dimethylaminostyryl)-4H-pyran (DCM), poly[2,5-bis(3,7-dimethyloctyloxy)-1,4-phenylenevinylene], poly[2-methoxy-5-(2'-ethylhexyloxy)-1,4-(1-cyanovinylene)phenylene], and poly[2-methoxy-5-(3,7-dimethyloctyloxy)-1,4-phenylenevinylene].

The red phosphorescent material used may be any material that emits red phosphorescence. Examples of the red phosphorescent material include metal complexes such as those of iridium, ruthenium, platinum, osmium, rhenium, and palladium. In these metal complexes, at least one of their ligands may have, for example, a phenylpyridine backbone, a bipyridyl backbone, or a porphyrin backbone. Specific examples include tris(1-phenylisoquinoline)iridium, bis[2-(2'-benzo[4,5-α]thienyl)pyridinato-N,C3']iridium(acetylacetonate) (btp2Ir(acac)), 2,3,7,8,12,13,17,18-octaethyl-12H,23H-porphyrin-platinum(II), bis[2-(2'-benzo[4,5-α](thienyl)pyridinato-N,C3']iridium, and bis(2-phenylpyridine)iridium (acetylacetonate).

In addition, a host material containing the red light-emitting material as a guest material may be used as the material of the red light-emitting layer 6. The host material functions to excite the red light-emitting material by generating excitons through the recombination of electrons and holes and transferring the energy of the excitons to the red light-emitting material (Forster transfer or Dexter transfer). To use the host material, for example, it may be doped with the guest material, namely, the red light-emitting material, as a dopant.

The host material used may be any material that has the above effect on the red light-emitting material. Examples of the host material used if the red light-emitting material is a red fluorescent material include distyrylarylene derivatives, naphthacene derivatives, perylene derivatives, distyrylbenzene derivatives, distyrylamine derivatives, quinolinolato metal complexes such as tris(8-quinolinolato)aluminum ($Alq_3$), triarylamine derivatives such as triphenylamine tetramer, oxadiazole derivatives, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi). These materials may be used alone or in combination of two or more, Examples of the host material used if the red light-emitting material is a red phosphorescent material include carbazole derivatives such as 3-phenyl-4-(1'-naphthyl)-5-phenylcarbazole and 4,4'-N,N'-dicarbazolebiphenyl (CBP); phenanthroline derivatives; triazole derivatives; quinolinolato metal complexes such as tris(8-quinolinolato)aluminum ($Alq_3$) and bis-(2-methyl-8-quinolinolato)-4-(phenylphenolato)aluminum; carbazolyl-containing compounds such as N-dicarbazolyl-3,5-benzene, poly(9-vinylcarbazole), 4,4',4"-tris(9-carbazolyl)triphenylamine, and 4,4'-bis(9-carbazolyl)-2,2'-dimethylbiphenyl; and 2,9-dimethyl-4,7-diphenyl-1,10-phenanthroline (BCP). These materials may be used alone or in combination of two or more.

If the host material is used in combination with the red light-emitting material (guest material), the content (dosage) of the red light-emitting material in the red light-emitting layer 6 is preferably 0.01% to 10% by weight, more preferably 0.1% to 5% by weight. If the content of the red light-emitting material falls within the above ranges, the red light-emitting layer 6 can emit light with a good balance of light intensity among the red light-emitting layer 6, the blue light-emitting layer 8, and the green light-emitting layer 9.

A red light-emitting material easily emits light because it has a relatively small energy gap (bandgap) between the lowest unoccupied molecular orbital and the highest occupied molecular orbital. Hence, a good balance of light emission among the light-emitting layers 6, 8, and 9 can be achieved if the red light-emitting layer 6 is disposed on the anode 3 side and the blue light-emitting layer 8 and the green light-emitting layer 9, which emit light less easily because they have larger bandgaps, are disposed on the cathode 12 side.

Intermediate Layer

The intermediate layer 7 is disposed between and in contact with the red light-emitting layer 6 and the blue light-emitting layer 8. The intermediate layer 7 functions to block energy transfer of excitons between the red light-emitting layer 6 and the blue light-emitting layer 8. This function allows both the red light-emitting layer 6 and the blue light-emitting layer 8 to emit light efficiently.

In particular, the intermediate layer 7 includes a first intermediate layer 71 adjacent to the red light-emitting layer 6 and the second intermediate layer 72 adjacent to the blue light-emitting layer 8.

The first intermediate layer 71 is disposed in contact with the red light-emitting layer 6 and mainly contains a first intermediate material, whereas the second intermediate layer 72 is disposed in contact with the blue light-emitting layer 8 and mainly contains a second intermediate material different from the first intermediate material.

With appropriately selected first and second intermediate materials, the intermediate layer 7, including the first intermediate layer 71 and the second intermediate layer 72, allows a good balance of light emission between the red light-emitting layer 6 and the blue light-emitting layer 8 to be achieved.

In particular, if the combination of the first and second intermediate materials is a combination of a material with a high carrier-transportation capability (electron-transportation capability and/or hole-transportation capability) and a material with a high tolerance to carriers, the intermediate layer 7 allows a good balance of light emission between the red light-emitting layer 6 and the blue light-emitting layer 8 to be achieved, as described above, while providing high durability and high light-emission efficiency (current efficiency and drive voltage).

The above effect can be enhanced by providing the intermediate layer 7 according to this embodiment between the red light-emitting layer 6 and the blue light-emitting layer 8 because there is a large difference between the bandgaps of the materials of the red light-emitting layer 6 and the blue light-emitting layer 8.

This will be specifically described. Referring to FIG. 2, the layers of the light-emitting device 1 are stacked on top of each other such that both the highest occupied molecular orbitals (HOMO) and the lowest unoccupied molecular orbitals (LUMO) of the materials of the layers rise gradually in energy level from the anode 3 side to the cathode 12 side. Arranging the highest occupied molecular orbitals (HOMO) and the lowest unoccupied molecular orbitals (LUMO) of the materials of the layers of the light-emitting device 1 in the above manner provides a good balance of carrier injection among the layers while reducing the drive voltage of the light-emitting device 1.

In FIG. 2, the energy level rises from top to bottom. In the present specification, the energy level is higher as the energy level (potential (eV)) is smaller and is lower as the energy level (potential (eV)) is larger. In FIG. 2, hence, the energy level (potential (eV)) decreases from top to bottom.

The highest occupied molecular orbital (HOMO) and the lowest unoccupied molecular orbital (LUMO) of the intermediate layer 7 will be described in more detail. The energy level of the highest occupied molecular orbital of the first intermediate material is higher than that of the material of the red light-emitting layer (first light-emitting layer) 6. In this case, the first intermediate layer 71 can limit the number of holes traveling from the red light-emitting layer 6 to the blue light-emitting layer 8, thus allowing a good balance of light emission between the red light-emitting layer 6 and the blue light-emitting layer 8 to be achieved. Also, the energy level of the highest occupied molecular orbital of the second intermediate material is higher than that of the material of the red light-emitting layer (first light-emitting layer) 6. In this case, the second intermediate layer 72 can also limit the number of holes traveling from the red light-emitting layer 6 to the blue light-emitting layer 8, thus allowing a good balance of light emission between the red light-emitting layer 6 and the blue light-emitting layer 8 to be achieved.

If the light-emitting layers, such as the red light-emitting layer 6 and the blue light-emitting layer 8, are formed only of light-emitting materials, the highest occupied molecular orbitals (HOMO) and the lowest unoccupied molecular orbitals (LUMO) of the materials of the light-emitting layers refer to those of the light-emitting materials. If the light-emitting layers are formed of light-emitting materials (guest materials) and host materials, the highest occupied molecular orbitals (HOMO) and the lowest unoccupied molecular orbitals (LUMO) of the materials of the light-emitting layers refer to those of the light-emitting materials or the host materials. The same holds true for the subsequent description.

In addition, the energy levels of the highest occupied molecular orbitals of the first and second intermediate materials lie between the energy levels of the highest occupied molecular orbitals of the red light-emitting layer 6 and the blue light-emitting layer 8. In this case, the intermediate layer 7 can alleviate the energy gap between the highest occupied molecular orbitals of the red light-emitting layer 6 and the blue light-emitting layer 8 (i.e., lower the barrier of the energy gap) to reduce the drive voltage of the light-emitting device 1.

In particular, if the energy level of the highest occupied molecular orbital of the first intermediate material is higher than that of the material of the red light-emitting layer 6, as described above, the difference between the energy levels of the highest occupied molecular orbitals of the first intermediate material and the material of the red light-emitting layer 6 is preferably 0.1 to 0.4 eV. In this case, a good balance of light emission between the red light-emitting layer 6 and the blue light-emitting layer 8 can be achieved while reducing the drive voltage of the light-emitting device 1.

In addition, the energy level of the lowest unoccupied molecular orbital of the first intermediate material is lower than that of the material of the blue light-emitting layer 8. In this case, the first intermediate layer 71 can limit the number of electrons traveling from the blue light-emitting layer 8 to the red light-emitting layer 6, thus allowing a good balance of light emission between the red light-emitting layer 6 and the blue light-emitting layer 8 to be achieved. Also, the energy level of the lowest unoccupied molecular orbital of the second intermediate material is lower than that of the material of the blue light-emitting layer 8. In this case, the second intermediate layer 72 can also limit the number of electrons traveling from the blue light-emitting layer 8 to the red light-emitting layer 6, thus allowing a good balance of light emission between the red light-emitting layer 6 and the blue light-emitting layer 8 to be achieved.

In addition, the energy levels of the lowest unoccupied molecular orbitals of the first and second intermediate materials lie between the energy levels of the lowest unoccupied molecular orbitals of the red light-emitting layer 6 and the blue light-emitting layer 8. In this case, the intermediate layer 7 can alleviate the energy gap between the lowest unoccupied molecular orbitals of the red light-emitting layer 6 and the blue light-emitting layer 8 (i.e., lower the barrier of the energy gap) to reduce the drive voltage of the light-emitting device 1.

In particular, if the energy level of the lowest unoccupied molecular orbital of the second intermediate material is lower than that of the material of the blue light-emitting layer 8, as described above, the difference between the energy levels of the lowest unoccupied molecular orbitals of the second intermediate material and the material of the blue light-emitting layer 8 is preferably 0.1 to 0.4 eV. In this case, a good balance of light emission between the red light-emitting layer 6 and the blue light-emitting layer 8 can be achieved while reducing the drive voltage of the light-emitting device 1.

In addition, the energy gap (bandgap) between the lowest unoccupied molecular orbital and the highest occupied molecular orbital of the first intermediate material is preferably larger than that of the red light-emitting layer 6. In this case, the energy of excitons generated by the red light-emitting layer 6 can be prevented from being transferred to the first intermediate layer 71. This results in a good balance of light emission between the red light-emitting layer 6 and the blue light-emitting layer 8.

In addition, the energy gap (bandgap) between the lowest unoccupied molecular orbital and the highest occupied molecular orbital of the second intermediate material is preferably larger than that of the blue light-emitting layer 8. In this case, the energy of excitons generated by the blue light-emitting layer 8 can be prevented from being transferred to the second intermediate layer 72. This results in a good balance of light emission between the red light-emitting layer 6 and the blue light-emitting layer 8.

The first intermediate layer 71 has both a hole-transportation capability and an electron-transportation capability so that the intermediate layer 7 can communicate holes and electrons between the red light-emitting layer 6 and the blue light-emitting layer 8. The first intermediate layer 71 preferably has a higher hole-transportation capability than the second intermediate layer 72. In this case, holes can be smoothly conveyed from the red light-emitting layer 6 to the blue light-emitting layer 8 through the intermediate layer 7.

From this viewpoint, the first intermediate material preferably contains an amine-based hole-transporting material (i.e., a hole-transporting material having an amine backbone). An amine-based hole-transporting material has a high hole-transportation capability. The use of such a hole-transporting material as the first intermediate material allows holes to be significantly smoothly conveyed from the red light-emitting layer 6 to the blue light-emitting layer 8 through the intermediate layer 7.

The amine-based hole-transporting material used for the first intermediate layer 71 may be any material that has an amine backbone and that provides the above effect. Of the hole-transporting materials described above, for example, those having an amine backbone may be used, and benzidine-based amine derivatives are preferred.

Among benzidine-based amine derivatives, those having two or more naphthyl groups are preferred as the amine-based hole-transporting material used for the intermediate layer 7. Such benzidine-based amine derivatives are exemplified by N,N'-bis(1-naphthyl)-N,N'-diphenyl-1,1'-biphenyl-4,4'-diamine (α-NPD), as represented by Chemical Formula 1 below, N,N,N',N'-tetranaphthyl-benzidine (TNB), as represented by Chemical Formula 2 below, and triphenyldiamine (TPD)r as represented by Chemical Formula 3 below.

Chemical Formula 1

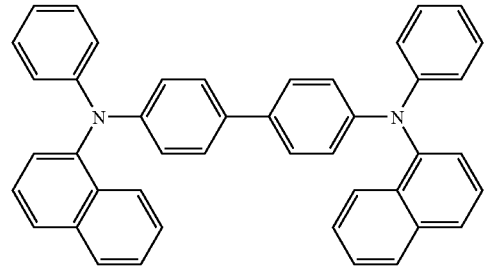

Chemical Formula 2

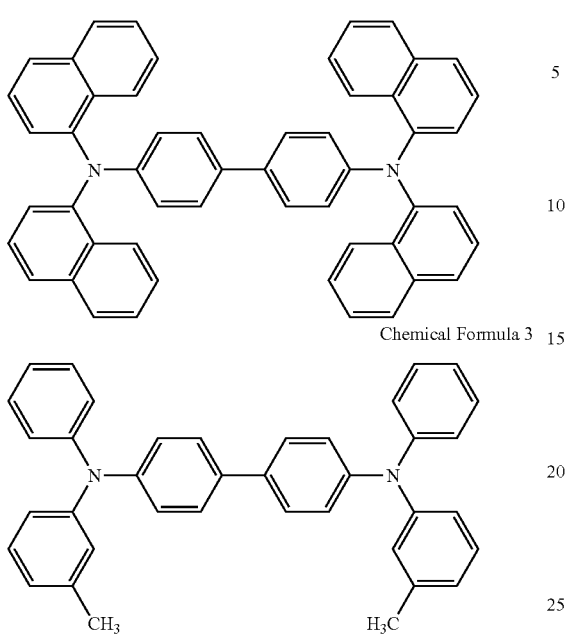

Chemical Formula 3

An amine-based hole-transporting material, which generally has a high hole-transportation capability, has a higher hole mobility than an acene-based bipolar material, as described below. Hence, holes can be smoothly conveyed from the red light-emitting layer 6 to the blue light-emitting layer 8 through the intermediate layer 7.

The content of the amine-based hole-transporting material in the first intermediate layer 71 is preferably, but not limited to, 10% to 90% by volume, more preferably 30% to 70% by volume, and most preferably 40% to 60% by volume.

The first intermediate layer 71 may also contain materials other than the first intermediate material.

The first intermediate layer 71 preferably has an average thickness of 1 to 50 nm, more preferably 3 to 30 nm, and most preferably 5 to 20 nm. In this case, a good balance of light emission between the red light-emitting layer 6 and the blue light-emitting layer 8 can be achieved while reducing the drive voltage of the light-emitting device 1.

If the average thickness of the first intermediate layer 71 falls below the above lower limit, it may be difficult to achieve high durability and high current efficiency, depending on, for example, the type of the first intermediate material and the film quality of the first intermediate layer 71. In addition, it may be difficult to sufficiently prevent energy transfer of excitons between the red light-emitting layer 6 and the blue light-emitting layer 8 to achieve a good balance of light emission between the red light-emitting layer 6 and the blue light-emitting layer 8, depending on, for example, the thickness of the second intermediate layer 72. If the average thickness of the first intermediate layer 71 exceeds the above upper limit, the drive voltage of the light-emitting device 1 tends to increase.

Also, the second intermediate layer 72 has both a hole-transportation capability and an electron-transportation capability so that the intermediate layer 7 can communicate holes and electrons between the red light-emitting layer 6 and the blue light-emitting layer 8. The second intermediate layer 72 preferably has a higher electron-transportation capability than the first intermediate layer 71. In this case, electrons can be smoothly conveyed from the blue light-emitting layer 8 to the red light-emitting layer 6 through the intermediate layer 7.

From this viewpoint, the second intermediate material preferably contains an acene-based bipolar material. An acene-based bipolar material has a high carrier-transportation capability (electron-transportation capability and hole-transportation capability) and a high tolerance to carriers. The use of such a bipolar material as the second intermediate material allows holes to be significantly smoothly conveyed from the red light-emitting layer 6 to the blue light-emitting layer 8 through the intermediate layer 7 and also allows electrons to be significantly smoothly conveyed from the blue light-emitting layer 8 to the red light-emitting layer 6 through the intermediate layer 7. In addition, the use of the bipolar material improves the carrier tolerance of the second intermediate layer 72.

The acene-based bipolar material used for the second intermediate layer 72 may be any material that has an acene backbone and that provides the above effect. Examples of the acene-based bipolar material include naphthalene derivatives, anthracene derivatives, tetracene derivatives, pentacene derivatives, hexacene derivatives, and heptacene derivatives. These materials may be used alone or in combination of two or more. In particular, anthracene derivatives are preferred.

Anthracene derivatives have a high electron-transportation capability, and their films can readily be formed by vapor deposition. Hence, if the acene-based bipolar material used is an anthracene derivative, the acene-based bipolar material (and therefore the second intermediate layer 72) can have a high electron-transportation capability, and a uniform second intermediate layer can readily be formed.

Among anthracene derivatives, those having naphthyl groups at the 9- and 10-positions of the anthracene backbone are preferred as the acene-based bipolar material used for the second intermediate layer 72. In this case, the above effect can be enhanced. Such anthracene derivatives are exemplified by 9,10-di(2-naphthyl)anthracene (ADN), as represented by Chemical Formula 4 below, 2-t-butyl-9,10-di(2-naphthyl)anthracene (TBADN), as represented by Chemical Formula 5 below, and 2-methyl-9,10-di(2-naphthyl)anthracene (MADN), as represented by Chemical Formula 6 below.

Chemical Formula 4

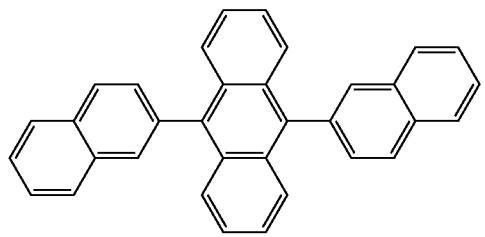

Chemical Formula 5

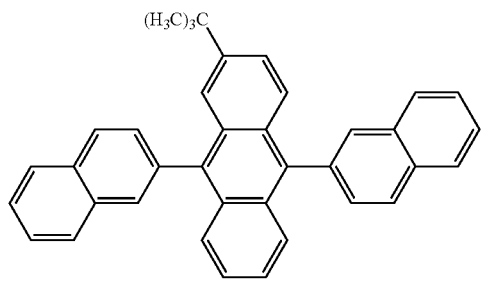

Chemical Formula 6

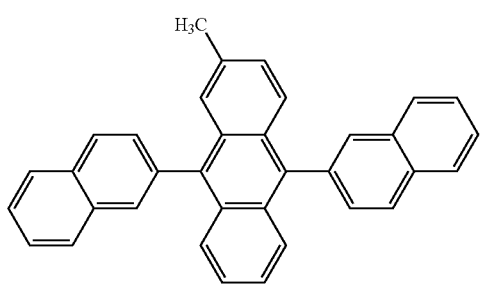

An acene-based bipolar material, which generally has a high electron-transportation capability, has a higher electron mobility than an amine-based hole-transporting material. Hence, electrons can be smoothly conveyed from the blue light-emitting layer 8 to the red light-emitting layer 6 through the intermediate layer 7.

The content of the acene-based bipolar material in the second intermediate layer 72 is preferably, but not limited to, 10% to 90% by volume, more preferably 30% to 70% by volume, and most preferably 40% to 60% by volume.

The second intermediate layer 72 may also contain materials other than the second intermediate material.

The second intermediate layer 72 preferably has an average thickness of 1 to 50 nm, more preferably 3 to 30 nm, and most preferably 3 to 20 nm. In this case, a good balance of light emission between the red light-emitting layer 6 and the blue light-emitting layer 8 can be achieved while reducing the drive voltage of the light-emitting device 1.

If the average thickness of the second intermediate layer 72 falls below the above lower limit, it may be difficult to achieve high durability and high current efficiency, depending on, for example, the type of the second intermediate material and the film quality of the second intermediate layer 72. In addition, it may be difficult to sufficiently prevent energy transfer of excitons between the red light-emitting layer 6 and the blue light-emitting layer 8 to achieve a good balance of light emission between the red light-emitting layer 6 and the blue light-emitting layer 8, depending on, for example, the thickness of the first intermediate layer 71. If the average thickness of the second intermediate layer 72 exceeds the above upper limit, the drive voltage of the light-emitting device 1 tends to increase.

The average thickness of the entire intermediate layer 7 is preferably 100 nm or less (1 to 100 nm), more preferably 3 to 50 nm, and most preferably 5 to 30 nm. In this case, a good balance of light emission between the red light-emitting layer 6 and the blue light-emitting layer 8 can be achieved while reducing the drive voltage of the light-emitting device 1.

In addition, the average thickness of the entire intermediate layer 7 is preferably larger than that of the red light-emitting layer 6. In this case, the durability of the intermediate layer 7, and therefore the durability of the light-emitting device 1, can be improved.

In addition, the average thickness of the entire intermediate layer 7 is preferably larger than that of the blue light-emitting layer 8. In this case, the durability of the intermediate layer 7, and therefore the durability of the light-emitting device 1, can be improved.

Blue Light-Emitting Layer

The blue light-emitting layer (second light-emitting layer) 8 contains a blue light-emitting material that emits blue light (second color).

The blue light-emitting material used is not particularly limited. Examples of the blue light-emitting material include various blue fluorescent materials and various blue phosphorescent materials. These materials may be used alone or in combination of two or more.

The blue fluorescent material used may be any material that emits blue fluorescence. Examples of the blue fluorescent material include distyryl derivatives, fluoranthene derivatives, pyrene derivatives, perylene and derivatives thereof, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-alt-co-(2-methoxy-5-{2-ethoxyhexyloxy}phenylene-1,4-diyl)], and poly[(9,9-dioctylfluorene-2,7-diyl)-co-(ethynylbenzene)]. These materials may be used alone or in combination of two or more.

The blue phosphorescent material used may be any material that emits blue phosphorescence. Examples of the blue phosphorescent material include metal complexes such as those of iridium, ruthenium, platinum, osmium, rhenium, and palladium. Specific examples include bis[4,6-difluorophenylpyridinato-N,C2']-picolinate-iridium, tris[2-(2,4-difluorophenyl)pyridinato-N,C2']iridium, bis[2-(3,5-trifluoromethyl)pyridinato-N,C2']-picolinate-iridium, and bis(4,6-difluorophenylpyridinato-N,C2')iridium(acetylacetonate).

In addition, like the red light-emitting layer 6, a host material containing the blue light-emitting material as a guest material may be used as the material of the blue light-emitting layer 8.

Green Light-Emitting Layer

The green light-emitting layer (third light-emitting layer) 9 contains a green light-emitting material that emits green light (third color).

The green light-emitting material used is not particularly limited. Examples of the green light-emitting material include various green fluorescent materials and various green phosphorescent materials. These materials may be used alone or in combination of two or more.

The green fluorescent material used may be any material that emits green fluorescence. Examples of the green fluorescent material include coumarin derivatives, quinacridone derivatives, 9,10-bis[(9-ethyl-3-carbazolyl)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-alt-co-(2-methoxy-5-(2-ethoxylhexyloxy)-1,4-phenylene)]. These materials may be used alone or in combination of two or more.

The green phosphorescent material used may be any material that emits green phosphorescence. Examples of the green phosphorescent material include metal complexes such as those of iridium, ruthenium, platinum, osmium, rhenium, and palladium. In these metal complexes, at least one of their ligands preferably has, for example, a phenylpyridine backbone, a bipyridyl backbone, or a porphyrin backbone. Specific examples include fac-tris(2-phenylpyridine)iridium (Ir(ppy)$_3$), bis(2-phenylpyridinato-N,C2')iridium (acetylacetonate), and fac-tris[5-fluoro-2-(5-trifluoromethyl-2-pyridinyl)phenyl-C,N]iridium.

In addition, like the red light-emitting layer 6, a host material containing the green light-emitting material as a guest material may be used as the material of the green light-emitting layer 9.

Electron-Transporting Layer

The electron-transporting layer 10 functions to transport electrons injected from the cathode 12 through the electron-injecting layer 11 to the green light-emitting layer 9.

Examples of the material (electron-transporting material) of the electron-transporting layer 10 include quinoline derivatives (such as organometallic complexes having 8-quinolinol or its derivative as a ligand, for example, tris(8-quinolinolato) aluminum ($Alq_3$)), oxadiazole derivatives, perylene derivatives, pyridine derivatives, pyrimidine derivatives, quinoxaline derivatives, diphenylquinone derivatives, and nitro-substituted fluorene derivatives. These materials may be used alone or in combination of two or more.

The average thickness of the electron-transporting layer 10 is preferably, but not limited to, about 0.1 to 1,000 nm, more preferably about 0.5 to 100 nm, and most preferably 1 to 50 nm.

Electron-Injecting Layer

The electron-injecting layer 11 functions to improve the efficiency of electron injection from the cathode 12.

Examples of the material (electron-injecting material) of the electron-injecting layer 11 include various inorganic insulating materials and various semiconductor materials.

Examples of inorganic insulating materials include alkali metal chalcogenides (oxides, sulfides, selenides, and tellurides), alkaline earth metal chalcogenides, alkali metal halides, and alkaline earth metal halides. These materials may be used alone or in combination of two or more. These materials can be used as the main material of the electron-injecting layer 11 to improve its electron-injection capability. In particular, the light-emitting device 1 can have high luminance if the electron-injecting layer 11 is formed of an alkali metal compound (such as an alkali metal chalcogenide or an alkali metal halide) because it has a very low work function.

Examples of alkali metal chalcogenides include $Li_2O$, LiO, $Na_2S$, $Na_2Se$, and NaO.

Examples of alkaline earth metal chalcogenides include CaO, BaO, SrO, BeO, BaS, MgO, and CaSe.

Examples of alkali metal halides include CsF, LiF, NaF, KF, LiCl, KCl, and NaCl.

Examples of alkaline earth metal halides include $CaF_2$, $BaF_2$, $SrF_2$, $MgF_2$, and $BeF_2$.

Examples of inorganic semiconductor materials include oxides, nitrides, and oxynitrides containing at least one element selected from the group consisting of lithium, sodium, barium, calcium, strontium, ytterbium, aluminum, gallium, indium, cadmium, magnesium, silicon, tantalum, antimony, and zinc. These materials may be used alone or in combination of two or more.

The average thickness of the electron-injecting layer 11 is preferably, but not limited to, about 0.1 to 1,000 nm, more preferably about 0.2 to 100 nm, and most preferably about 0.2 to 50 nm.

Sealing Member

The sealing member 13 is disposed so as to cover and hermetically seal the anode 3, the laminate 15, and the cathode 12, thus functioning to block oxygen and water. The sealing member 13 has benefits such as improving the reliability of the light-emitting device 1 and preventing deterioration (improving durability).

Examples of the material of the sealing member 13 include aluminum, gold, chromium, niobium, tantalum, titanium, alloys thereof, silicon oxide, and various resins. If the sealing member 13 is formed of a conductive material, an insulating film, if necessary, is preferably provided between the sealing member 13 and the anode 3, the laminate 15, and the cathode 12 to prevent a short-circuit.

Alternatively, the sealing member 13 may be plate-shaped and disposed opposite the substrate 2, with the gap therebetween sealed using a sealant such as a thermosetting resin.

In the light-emitting device 1 thus configured, the intermediate layer 7 includes the first intermediate layer 71 and the second intermediate layer 72. With appropriately selected first and second intermediate materials, the intermediate layer 7 allows a good balance of light emission between the red light-emitting layer 6 and the blue light-emitting layer 8 to be achieved.

In particular, if the combination of the first and second intermediate materials is a combination of a material with a high carrier-transportation capability (electron-transportation capability and/or hole-transportation capability) and a material with a high tolerance to carriers, the intermediate layer 7 allows a good balance of light emission between the red light-emitting layer 6 and the blue light-emitting layer 8 to be achieved, as described above, while providing high durability and high current efficiency.

In this embodiment, additionally, the light-emitting device 1 includes, in order from the anode 3 side to the cathode 12 side, the red light-emitting layer 6, the intermediate layer 7, the blue light-emitting layer 8, and the green light-emitting layer 9, so that the device 1 can relatively easily be adapted to emit white light with a good balance between red (R) light, green (G) light, and blue (B) light.

In the above order of layers, particularly, the intermediate layer 7 is disposed between the red light-emitting layer 6 and the blue light-emitting layer 8, so that the device 1 can emit white light with a good balance of light emission among the red light-emitting layer 6, the blue light-emitting layer 8, and the green light-emitting layer 9 while having significantly high durability and current efficiency.

The above light-emitting device 1 can be produced by, for example, the following process.

(1) First, the substrate 2 is prepared, and the anode 3 is formed on the substrate 2.

The anode 3 may be formed by, for example, dry plating such as chemical vapor deposition (CVD) (e.g., plasma-enhanced CVD or thermal CVD) or vacuum deposition; wet plating such as electroplating; spraying; the sol-gel process; metal-organic deposition (MOD); or bonding metal foil.

(2) Next, the hole-injecting layer 4 is formed on the anode 3.

The hole-injecting layer 4 may be formed by, for example, a vapor process based on dry plating such as CVD, vacuum deposition, or sputtering.

The hole-injecting layer 4 may also be formed by, for example, dissolving or dispersing the hole-injecting material in a solvent or dispersing medium, applying the material for forming the hole-injecting layer 4 onto the anode 3, and drying the material (removing the solvent or dispersing medium).

The material for forming the hole-injecting layer 4 may be applied by various coating methods such as spin coating, roll coating, or ink-jet printing. Such coating methods can be used to form the hole-injecting layer 4 relatively easily.

Examples of the solvent or dispersing medium used for the preparation of the material for forming the hole-injecting layer 4 include various inorganic solvents, various organic solvents, and mixed solvents.

The drying may be performed, for example, by leaving the substrate 2 in atmospheric pressure or in a vacuum atmosphere, by heat treatment, or by spraying inert gas.

Before the above step, the top surface of the anode 3 may be subjected to oxygen plasma treatment. This treatment can be performed to make the top surface of the anode 3 lyophilic, to remove (clean) organic matter deposited on the top surface of the anode 3, and to adjust the work function of the top surface of the anode 3.

For example, the oxygen plasma treatment is preferably performed at a plasma power of about 100 to 800 W, an oxygen gas flow rate of about 50 to 100 mL/min, a workpiece (anode 3) transportation speed of about 0.5 to 10 mm/sec, and a substrate temperature of about 70° C. to 90° C.

(3) Next, the hole-transporting layer 5 is formed on the hole-injecting layer 4.

The hole-transporting layer 5 may be formed by, for example, a vapor process based on dry plating such as CVD, vacuum deposition, or sputtering.

The hole-transporting layer 5 may also be formed by, for example, dissolving or dispersing the hole-transporting material in a solvent or dispersing medium, applying the material for forming the hole-transporting layer 5 onto the hole-injecting layer 4, and drying the material (removing the solvent or dispersing medium).

(4) Next, the red light-emitting layer 6 is formed on the hole-transporting layer 5.

The red light-emitting layer 6 may be formed by, for example, a vapor process based on dry plating such as CVD, vacuum deposition, or sputtering.

(5) Next, the first intermediate layer 71 and the second intermediate layer 72 are sequentially formed on the red light-emitting layer 6, thus forming the intermediate layer 7.

The first intermediate layer 71 and the second intermediate layer 72 may be formed by, for example, a vapor process based on dry plating such as CVD, vacuum deposition, or sputtering.

(6) Next, the blue light-emitting layer 8 is formed on the intermediate layer 7.

The blue light-emitting layer 8 may be formed by, for example, a vapor process based on dry plating such as CVD, vacuum deposition, or sputtering.

(7) Next, the green light-emitting layer 9 is formed on the blue light-emitting layer 8.

The green light-emitting layer 9 may be formed by, for example, a vapor process based on dry plating such as CVD, vacuum deposition, or sputtering.

(8) Next, the electron-transporting layer 10 is formed on the green light-emitting layer 9.

The electron-transporting layer 10 may be formed by, for example, a vapor process based on dry plating such as CVD, vacuum deposition, or sputtering.

The electron-transporting layer 10 may also be formed by, for example, dissolving or dispersing the electron-transporting material in a solvent or dispersing medium, applying the material for forming the electron-transporting layer 10 onto the green light-emitting layer 9, and drying the material (removing the solvent or dispersing medium).

(9) Next, the electron-injecting layer 11 is formed on the electron-transporting layer 10.

If the electron-injecting layer 11 is formed of an inorganic material, it may be formed by, for example, a vapor process based on dry plating such as CVD, vacuum deposition, or sputtering, or by applying and firing an inorganic microparticle ink.

(10) Next, the cathode 12 is formed on the electron-injecting layer 11.

The cathode 12 may be formed by, for example, vacuum deposition, sputtering, bonding metal foil, or applying and firing a metal microparticle ink.

Thus, the light-emitting device 1 can be produced by the above process.

Finally, the sealing member 13 is placed on and bonded to the substrate 2 so as to cover the light-emitting device 1.

Second Embodiment

Figure 3:
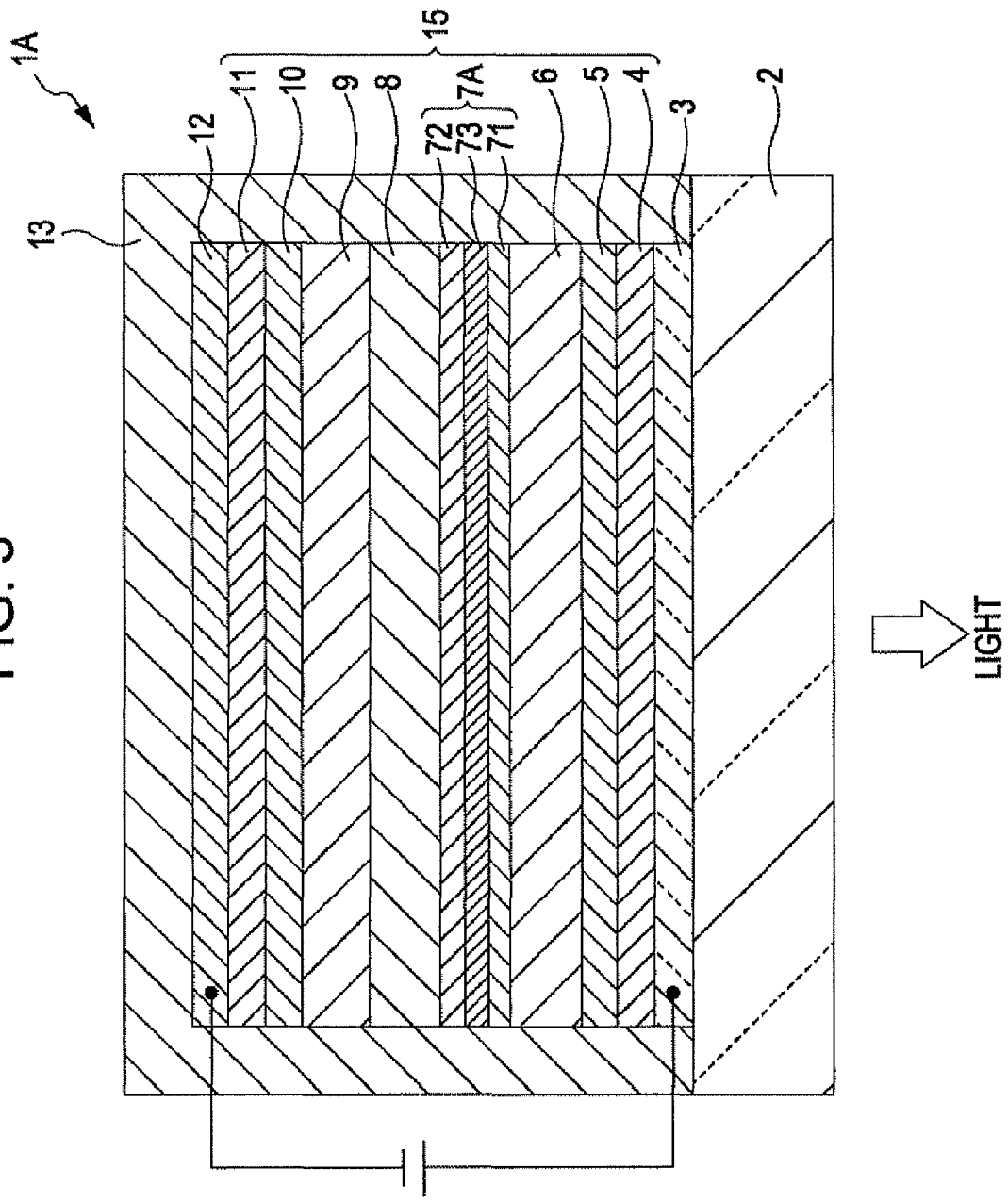
FIG. 3 is a longitudinal sectional view schematically showing a light-emitting device according to a second embodiment of the invention.
Figure 4:
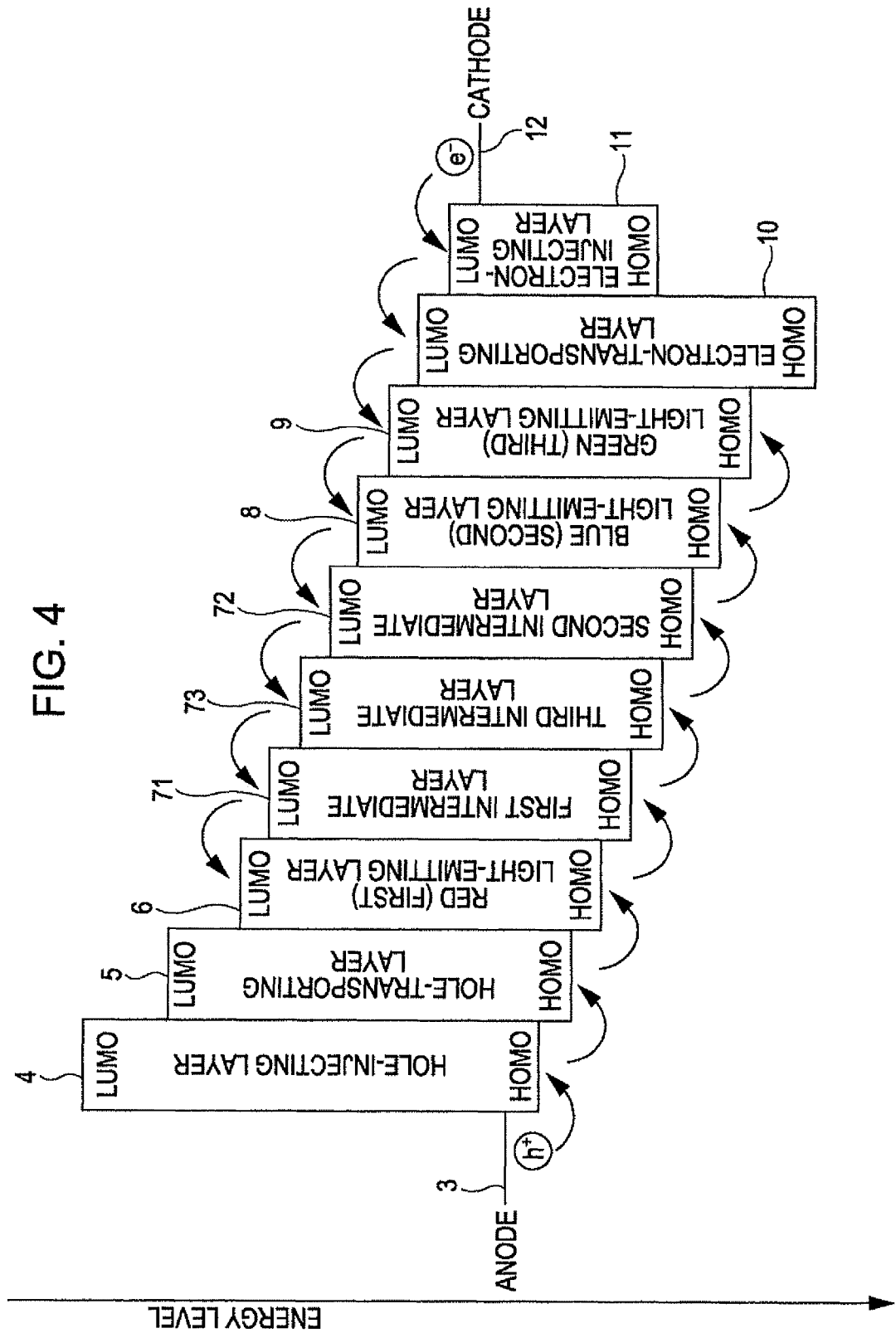
FIG. 4 is a diagram illustrating the energy levels of individual layers of the light-emitting device shown in FIG. 3.

FIG. 3 is a longitudinal sectional view schematically showing a light-emitting device according to a second embodiment of the invention. FIG. 4 is a diagram illustrating the energy levels of individual layers of the light-emitting device shown in FIG. 3. For convenience of illustration, the top of FIG. 3 is referred to as the "stop" of the device, whereas the bottom of FIG. 2 is referred to as the "bottom" of the device.

A light-emitting device 1A according to this embodiment is the same as the light-emitting device 1 according to the first embodiment except that a third intermediate layer is disposed between the first and second intermediate layers.

In the light-emitting device 1A according to this embodiment, the anode 3, the hole-injecting layer 4, the hole-transporting layer 5, the red light-emitting layer (first light-emitting layer) 6, an intermediate layer 7A, the blue light-emitting layer (second light-emitting layer) 8, the green light-emitting layer (third light-emitting layer) 9, the electron-transporting layer 10, the electron-injecting layer 11, and the cathode 12 are stacked in the above order.

The intermediate layer 7A includes a third intermediate layer 73 disposed between and in contact with the first intermediate layer 71 and the second intermediate layer 72.

The third intermediate layer 73 contains a third intermediate material different from the first and second intermediate materials. With appropriately selected first, second, and third intermediate materials, the intermediate layer 7A allows a good balance of light emission between the red light-emitting layer 6 and the blue light-emitting layer 8 to be achieved. This extends the range of choice of materials that can be used for the light-emitting device 1A, thus providing high flexibility in the design of the light-emitting device 1A.

This will be specifically described. Referring to FIG. 4, the layers of the light-emitting device 1A are stacked on top of each other such that both the highest occupied molecular orbitals (HOMO) and the lowest unoccupied molecular orbitals (LUMO) of the materials of the layers rise gradually in energy level from the anode 3 side to the cathode 12 side. Arranging the highest occupied molecular orbitals (HOMO) and the lowest unoccupied molecular orbitals (LUMO) of the materials of the layers of the light-emitting device 1A in the above manner provides a good balance of carrier injection among the layers while reducing the drive voltage of the light-emitting device 1A.

In FIG. 4, as in FIG. 2, the energy level rises from top to bottom. In FIG. 4, hence, the energy level (potential (eV)) decreases from top to bottom.

The highest occupied molecular orbital (HOMO) and the lowest unoccupied molecular orbital (LUMO) of the intermediate layer 7A will be described in more detail. The energy level of the highest occupied molecular orbital of the third intermediate material lies between the energy levels of the highest occupied molecular orbitals of the first and second intermediate layers. In this case, holes can be smoothly conveyed from the first intermediate layer 71 to the second intermediate layer 72 through the third intermediate layer 73.

In addition, the energy level of the lowest unoccupied molecular orbital of the third intermediate material lies between the energy levels of the lowest unoccupied molecular orbitals of the first and second intermediate materials. In this case, electrons can be smoothly conveyed from the second intermediate layer 72 to the first intermediate layer 71 through the third intermediate layer 73.

The third intermediate layer 73 has both a hole-transportation capability and an electron-transportation capability so that the intermediate layer 7 can communicate holes and electrons between the red light-emitting layer 6 and the blue light-emitting layer 8. The characteristics, such as the hole-transportation capability and the electron-transportation capability, of the first intermediate layer 71 preferably lie midway between those of the first intermediate layer 71 and those of the second intermediate layer 72. In this case, holes can be smoothly conveyed from the red light-emitting layer 6 to the blue light-emitting layer 8 through the intermediate layer 7.

The third intermediate material used for the third intermediate layer 73 may be one similar to the first and second intermediate materials, and such materials may be used alone or in combination.

The light-emitting device 1 and the light-emitting device 1A described above may be used as, for example, light sources. In addition, a plurality of light-emitting devices 1 or light-emitting devices 1A may be arranged in a matrix to constitute a display. In this case, a reliable display or electronic apparatus can be provided.

The display-driving system used is not particularly limited and may be either an active-matrix system or a passive-matrix system.

Next, an example of a display according to an embodiment of the invention will be described.

Figure 5:
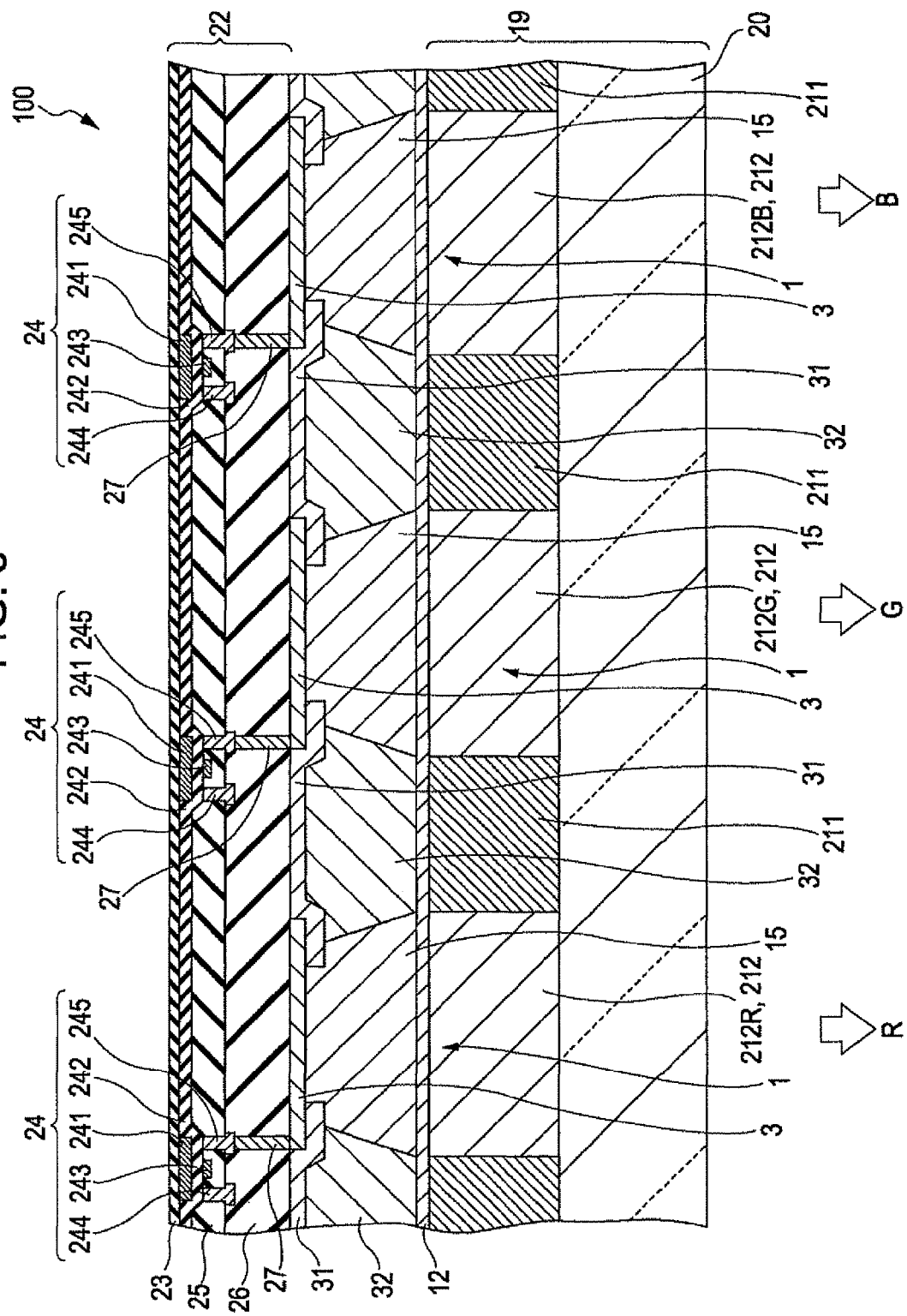
FIG. 5 is a longitudinal sectional view showing a display according to an embodiment of the invention.

FIG. 5 is a longitudinal sectional view showing the display according to this embodiment.

Referring to FIG. 5, a display 100 includes a color filter 19, a plurality of light-emitting devices 1 on the color filter 19, and a circuit section 22 on the light-emitting devices 1.

The color filter 19 includes a substrate 20, a partition 211 on the substrate 20, and a plurality of coloring portions 212 on the substrate 20.

The substrate 20 is, for example, a colorless transparent glass substrate.

The partition 211 divides the region over the substrate 20 into a plurality of regions. The partition (light-shielding portion) 211 is preferably, but not limited to, black. In this case, light passing through the adjacent coloring portions 212 can reliably be prevented from being mixed, so that a sharp image can reliably be displayed.

The coloring portions 212 are disposed in the individual regions surrounded by the partition 211. In FIG. 3, the coloring portions 212 include red coloring portions 212R, green coloring portions 212G, and blue coloring portions 212B so that white light W from the light-emitting devices 1 can be converted into red light through the coloring portions 212R, into green light through the coloring portions 212G, and into blue light through the coloring portions 212B. In this case, a full-color image can be displayed.

The light-emitting devices 1 correspond to the individual coloring portions 212. The adjacent light-emitting devices 1 are partitioned by a first partitioning portion 31 and a second partitioning portion 32.

The circuit section 22 includes a protective layer 23 formed of, for example, a silicon oxide layer, drive thin-film transistors (TFTS; switching elements) 24 disposed on the protective layer 23 and corresponding to the individual light-emitting devices 1, a first interlayer insulating layer 25, and a second interlayer insulating layer 26.

The drive TFTs 24 each include a semiconductor layer 241 formed of silicon, a gap insulating layer 242 on the semiconductor layer 241, a gate electrode 243 on the gap insulating layer 242, a source electrode 244, and a drain electrode 245.

In this embodiment, the anodes 3 of the light-emitting devices 1 constitute pixel electrodes and are electrically connected to the drain electrodes 245 of the drive TFTs 24 via wiring lines 27. The cathode 12 of the light-emitting devices 1 constitutes a common electrode.

The above display 100 may be configured as a monochrome display or as a color display using selected materials for the light-emitting devices 1.

The display 100 can be incorporated in various electronic apparatuses.

Figure 6:
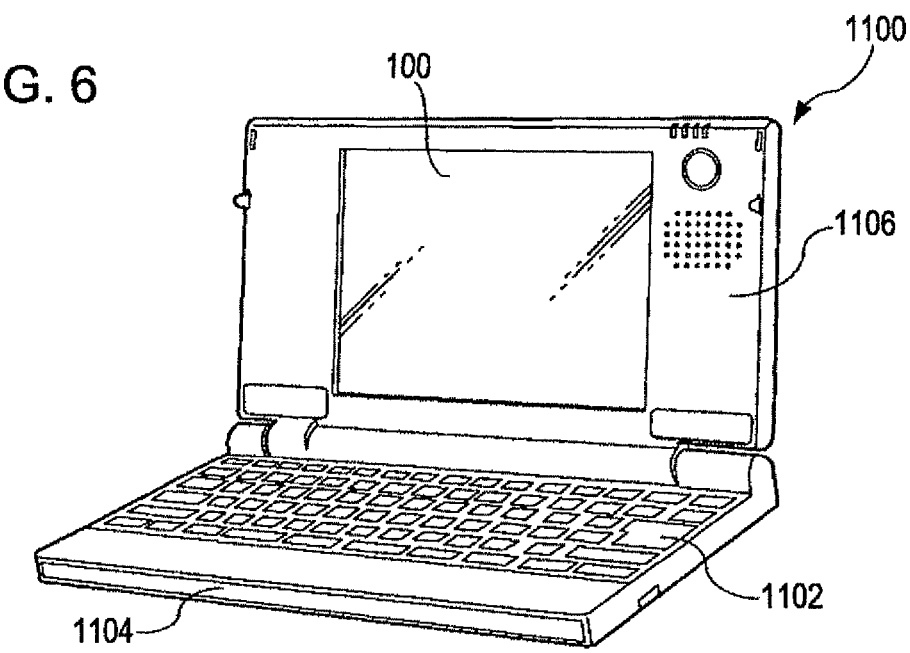
FIG. 6 is a perspective view showing a mobile (notebook) personal computer as an example of an electronic apparatus according to an embodiment of the invention.

FIG. 6 is a perspective view showing a mobile (notebook) personal computer as an example of an electronic apparatus according to an embodiment of the invention.

In FIG. 6, a personal computer 1100 includes a main body 1104 having a keyboard 1102 and a display unit 1106 having a display section. The display unit 1106 is supported so as to be rotatable relative to the main body 1104 about a hinge.

In the personal computer 1100, the display section of the display unit 1106 includes the display 100 described above.

Figure 7:
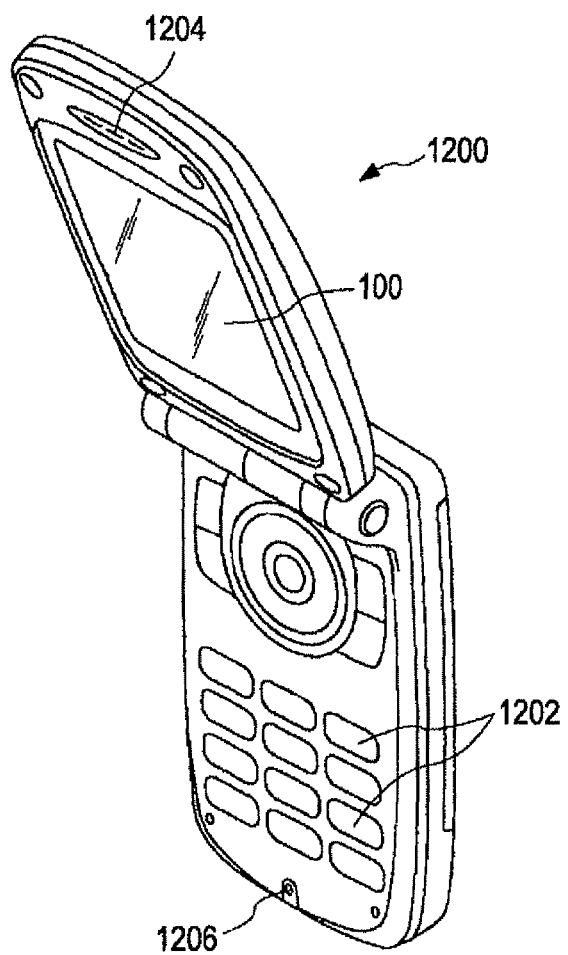
FIG. 7 is a perspective view showing a cellular phone (or PHS) as an example of an electronic apparatus according to another embodiment of the invention.

FIG. 7 is a perspective view showing a cellular phone (or PHS) as an example of an electronic apparatus according to another embodiment of the invention.

In FIG. 7, a cellular phone 1200 includes a plurality of operating buttons 1202, an earpiece 1204, a mouthpiece 1206, and a display section.

In the cellular phone 1200, the display section includes the display 100 described above.

Figure 8:
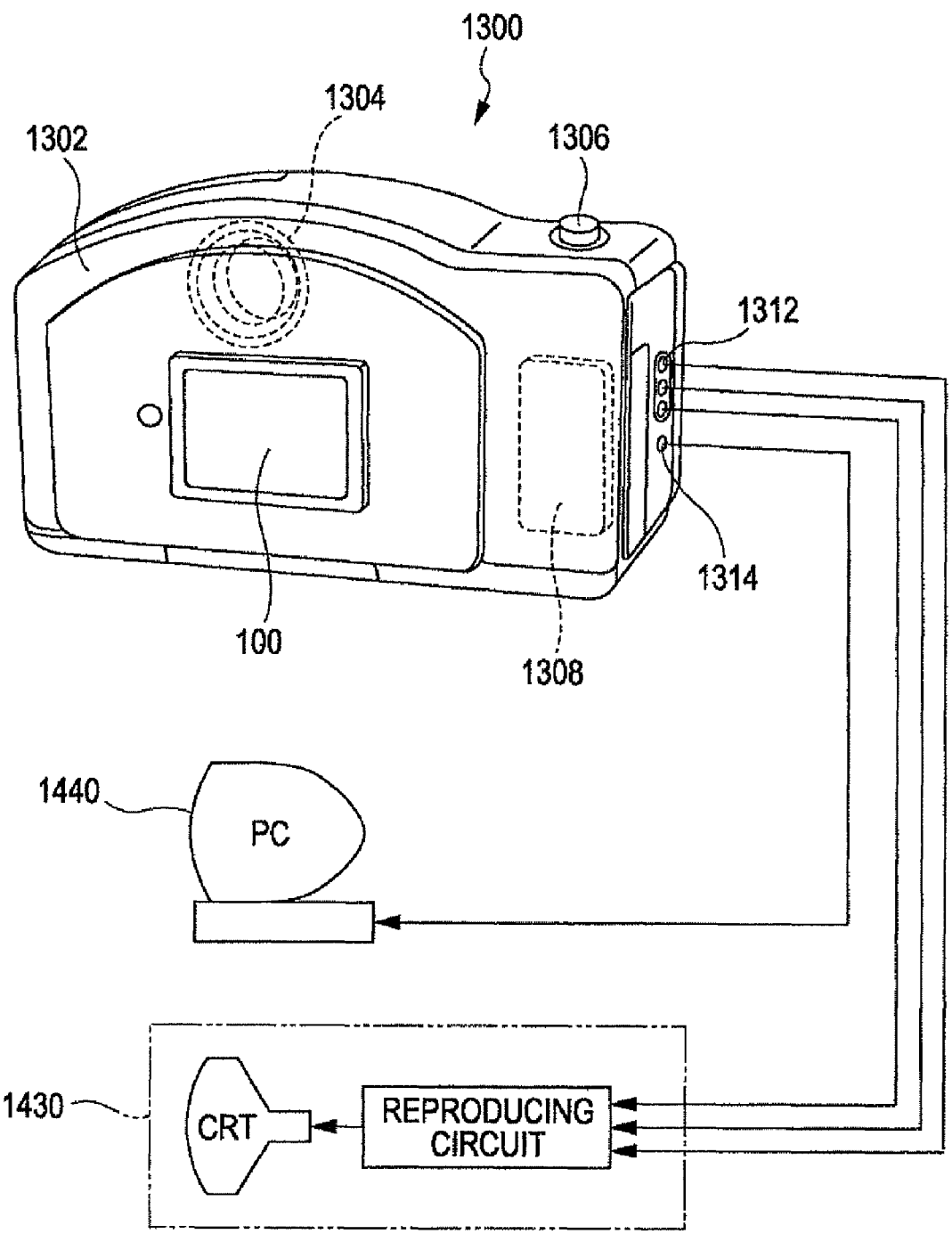
FIG. 8 is a perspective view showing a digital still camera as an example of an electronic apparatus according to another embodiment of the invention.

FIG. 8 is a perspective view showing a digital still camera as an example of an electronic apparatus according to another embodiment of the invention, where connections to external devices are also briefly shown.

While a normal camera exposes a silver-salt photographic film to an optical image of a subject, a digital still camera 1300 photoelectrically converts an optical image of a subject into imaging signals (image signals) through an imaging device such as a charge-coupled device (CCD).

The digital still camera 1300 includes a display section on the rear of a case (body) 1302 to display an image based on the imaging signals generated by the imaging device. That is, the display section functions as a viewfinder for displaying an electronic image of the subject.

In the digital still camera 1300, the display section includes the display 100 described above.

The case 1302 incorporates a circuit board 1308 on which a memory is mounted to store the imaging signals, The digital still camera 1300 also includes a light-receiving unit 1304 on the front of the case 1302 (on the backside in FIG. 8). The light-receiving unit 1304 includes, for example, an optical lens (imaging optical system) and the imaging device.

When the user presses a shutter button 1306 while seeing a subject image displayed on the display section, the imaging signals of the imaging device at that time are transmitted to and stored in the memory on the circuit board 1308.

The digital still camera 1300 also has video-signal output terminals 1312 and a data-communication input/output terminal 1314 on the side of the case 1302. The video-signal output terminals 1312 are optionally connected to a monitor 1430, whereas the data-communication input/output terminal 1314 is optionally connected to a personal computer 1440. With a predetermined manipulation, the imaging signals can be fed from the memory on the circuit board 1308 to the monitor 1430 and the personal computer 1440.

In addition to the personal computer of FIG. 6 (mobile personal computer), the cellular phone of FIG. 7, and the digital still camera of FIG. 8, examples of electronic apparatuses according to embodiments of the invention include television sets, viewfinder- or monitor-equipped camcorders, laptop personal computers, car navigation systems, pagers, electronic organizers (with or without communications capabilities), electronic dictionaries, calculators, electronic game machines, word processors, work stations, video phones, security monitors, electronic binoculars, POS terminals, touch panel-equipped devices (such as cash dispensers of financial institutions and automatic ticket machines), medical equipment (such as electronic thermometers, sphygmomanometers, blood glucose meters, electrocardiograph displays, medical ultrasound equipment, and endoscope displays), fish finders, a variety of measurement equipment, a variety of instruments (such as those used for cars, aircrafts, and ships), flight simulators, various other monitors, and projection displays such as projectors.

The light-emitting devices, displays, and electronic apparatuses according to the embodiments shown in the drawings have been described above, although the invention is not limited thereto.

The light-emitting devices according to the above embodiments, for example, include three light-emitting layers, although they may include two or four or more light-emitting layers. In addition, the colors of light of the light-emitting layers are not limited to the three colors used in the above embodiments, namely, red, green, and blue. Furthermore, the order of the light-emitting layers is not limited to those described in the above embodiments, and they may be stacked in the order of RBG, BRG, BGR, GBR, or GRB from the anode side to the cathode side. Two or four or more light-emitting layers can be used to emit white light by adjusting the emission spectra of the light-emitting layers.

The intermediate layer may be provided in at least one of the interfaces between the light-emitting layers, and two or more intermediate layers may be provided.

EXAMPLES

Next, examples of the invention will be described.
1. Production of Light-Emitting Device Example 1

(1) First, a transparent glass substrate with an average thickness of 0.5 mm was prepared. An ITO electrode (anode) with an average thickness of 100 nm was formed on the substrate by sputtering.

The substrate was dipped in ethanol and was subjected to ultrasonic cleaning before the substrate was subjected to oxygen plasma treatment.

(2) Next, a hole-injecting layer with an average thickness of 20 nm was formed on the ITO electrode by vacuum deposition using CuPc.

(3) Next, a hole-transporting layer with an average thickness of 40 nm was formed on the hole-injecting layer by vacuum deposition using α-NPD.

(4) Next, a red light-emitting layer (first light-emitting layer) with an average thickness of 10 m was formed on the hole-transporting layer by vacuum deposition using the material of the red light-emitting layer. The material of the red light-emitting layer contained RD001 (manufactured by Idemitsu Kosan Co., Ltd.) as a red light-emitting material (guest material) and RH001 (manufactured by Idemitsu Kosan Co., Ltd.) as a host material. The content (dosage) of the red light-emitting material (dopant) in the red light-emitting layer was 1.0% by weight.

(5) Next, a first intermediate layer with an average thickness of 10 nm was formed on the red light-emitting layer by vacuum deposition using the first intermediate material, and a second intermediate layer with an average thickness of 10 nm was formed on the first intermediate layer by vacuum deposition using the second intermediate material, thus forming an intermediate layer. The first intermediate material used was α-NPD, represented by Chemical Formula 1 above, which is an amine-based hole-transporting material. The second intermediate material used was TBADN, represented by Chemical Formula 5 above, which is an acene-based bipolar material.

(6) Next, a blue light-emitting layer (second light-emitting layer) with an average thickness of 15 nm was formed on the intermediate layer by vacuum deposition using the material of the blue light-emitting layer. The material of the blue light-emitting layer contained BD102 (manufactured by Idemitsu Kosan Co., Ltd.) as a blue light-emitting material (guest material) and BH215 (manufactured by Idemitsu Kosan Co., Ltd.) as a host material. The content (dosage) of the blue light-emitting material (dopant) in the blue light-emitting layer was 5.0% by weight.

(7) Next, a green light-emitting layer (third light-emitting layer) with an average thickness of 25 nm was formed on the blue light-emitting layer by vacuum deposition using the material of the green light-emitting layer. The material of the green light-emitting layer contained GD206 (manufactured by Idemitsu Kosan Co., Ltd.) as a green light-emitting material (guest material) and BH215 (manufactured by Idemitsu Kosan Co., Ltd.) as a host material. The content (dosage) of the green light-emitting material (dopant) in the green light-emitting layer was 8.0% by weight.

(8) Next, an electron-transporting layer with an average thickness of 20 nm was formed on the green light-emitting layer by vacuum deposition using tris(8-quinolinolato)aluminum ($Alq_3$).

(9) Next, an electron-injecting layer with an average thickness of 0.5 nm was formed on the electron-transporting layer by vacuum deposition using lithium fluoride (LiF).

(10) Next, a cathode with an average thickness of 150 nm was formed on the electron-injecting layer by vacuum deposition using aluminum.

(11) Next, a glass protective cover (sealing member) was placed over the layers and was bonded and sealed with epoxy resin.

Light-emitting devices as shown in FIG. 1 were thus produced by the above process.

The energy level of the HOMO of the first intermediate material was higher than that of the material of the red light-emitting layer (host material), and their difference was 0.2 eV.

The energy level of the LUMO of the second intermediate material was lower than that of the material of the blue light-emitting layer (host material), and their difference was 0.2 ev.

Example 2

Light-emitting devices were produced in the same manner as in Example 1 expect that the first intermediate layer had an average thickness of 5 nm.

The energy level of the HOMO of the first intermediate material was higher than that of the material of the red light-emitting layer (host material), and their difference was 0.2 eV.

The energy level of the LUMO of the second intermediate material was lower than that of the material of the blue light-emitting layer (host material), and their difference was 0.2 eV.

Example 3

Light-emitting devices were produced in the same manner as in Example 1 expect that the second intermediate layer had an average thickness of 1 nm.

The energy level of the HOMO of the first intermediate material was higher than that of the material of the red light-emitting layer (host material), and their difference was 0.2 eV.

The energy level of the LUMO of the second intermediate material was lower than that of the material of the blue light-emitting layer (host material), and their difference was 0.2 eV.

Example 4

Light-emitting devices were produced in the same manner as in Example 1 expect that the second intermediate layer had an average thickness of 5 nm.

The energy level of the HOMO of the first intermediate material was higher than that of the material of the red light-emitting layer (host material), and their difference was 0.2 eV.

The energy level of the LUMO of the second intermediate material was lower than that of the material of the blue light-emitting layer (host material), and their difference was 0.2 eV.

Example 5

Light-emitting devices were produced in the same manner as in Example 1 expect that the first intermediate material used was TPD, represented by Chemical Formula 3 above.

The energy level of the HOMO of the first intermediate material was higher than that of the material of the red light-emitting layer (host material), and their difference was 0.3 eV.

The energy level of the LUMO of the second intermediate material was lower than that of the material of the blue light-emitting layer (host material), and their difference was 0.2 eV.

Example 6

Light-emitting devices were produced in the same manner as in Example 1 expect that the second intermediate material used was ADN, represented by Chemical Formula 4 above.

The energy level of the HOMO of the first intermediate material was higher than that of the material of the red light-emitting layer (host material), and their difference was 0.2 eV.

The energy level of the LUMO of the second intermediate material was lower than that of the material of the blue light-emitting layer (host material), and their difference was 0.3 eV.

Example 7

Light-emitting devices were produced in the same manner as in Example 1 expect that a third intermediate layer was formed between the formation of the first intermediate layer and the formation of the second intermediate layer in Step (5), that the second intermediate material used was ADN, represented by Chemical Formula 4 above, and that the third intermediate material used was TBADN, represented by Chemical Formula 5 above. Thus, light-emitting devices as shown in FIG. 3 were produced.

The third intermediate layer was formed on the first intermediate layer by vacuum deposition using the third intermediate material and had an average thickness of 10 nm.

The energy level of the HOMO of the first intermediate material was higher than that of the material of the red light-emitting layer (host material), and their difference was 0.2 eV.

The energy level of the LUMO of the second intermediate material was lower than that of the material of the blue light-emitting layer (host material), and their difference was 0.2 eV.

Example 8

Light-emitting devices were produced in the same manner as in Example 7 expect that the second intermediate layer had an average thickness of 30 nm.

The energy level of the HOMO of the first intermediate material was higher than that of the material of the red light-emitting layer (host material), and their difference was 0.2 eV.

The energy level of the LUMO of the second intermediate material was lower than that of the material of the blue light-emitting layer (host material), and their difference was 0.2 eV.

Comparative Example 1

Light-emitting devices were produced in the same manner as in Example 1 expect that the second intermediate layer was omitted.

The energy level of the HOMO of the first intermediate material was higher than that of the material of the red light-emitting layer (host material), and their difference was 0.3 eV.

The energy level of the LUMO of the second intermediate material was lower than that of the material of the blue light-emitting layer (host material), and their difference was 0.3 eV.

Comparative Example 2

Light-emitting devices were produced in the same manner as in Example 1 expect that the second intermediate layer was omitted.

The energy level of the HOMO of the first intermediate material was higher than that of the material of the red light-emitting layer (host material), and their difference was 0.2 eV.

The energy level of the LUMO of the second intermediate material was lower than that of the material of the blue light-emitting layer (host material), and their difference was 0.3 eV.

2. Evaluation 2-1. Evaluation of Light-Emission Efficiency

The light-emitting devices of the examples of the invention and the comparative examples were supplied with a constant current of 10 $mA/cm^2$ from a DC power supply, and their voltages (drive voltages) and current efficiencies were measured. For each of the examples of the invention and the comparative examples, the measurement was performed on five light-emitting devices.

The results are shown in Table 1.

TABLE 1

| | Chromaticity (CIE) | | | | Luminance lifetime | Light-emission efficiency | |
|---|---|---|---|---|---|---|---|
| | 1 mA/cm² | | 50 mA/cm² | | 100 mA/cm² | Current efficiency at 10 mA/cm² | Drive voltage at 10 mA/cm² |
| | x | y | x | y | (hr) | (cd/A) | (V) |
| Example 1 | 0.41 | 0.33 | 0.38 | 0.30 | 1,000 | 11.5 | 7.5 |
| Example 2 | 0.42 | 0.35 | 0.39 | 0.32 | 800 | 12.0 | 7.7 |
| Example 3 | 0.38 | 0.34 | 0.36 | 0.31 | 700 | 13.0 | 7.9 |
| Example 4 | 0.40 | 0.35 | 0.36 | 0.32 | 900 | 12.5 | 7.6 |
| Example 5 | 0.38 | 0.33 | 0.35 | 0.30 | 1,100 | 11.5 | 8.0 |
| Example 6 | 0.37 | 0.34 | 0.33 | 0.31 | 1,100 | 11.5 | 8.0 |
| Example 7 | 0.44 | 0.38 | 0.40 | 0.36 | 1,500 | 10.5 | 8.6 |
| Example 8 | 0.44 | 0.39 | 0.41 | 0.36 | 1,700 | 10.0 | 9.0 |
| Comparative Example 1 | 0.37 | 0.36 | 0.35 | 0.35 | 200 | 14.0 | 8.0 |
| Comparative Example 2 | 0.35 | 0.36 | 0.33 | 0.35 | 220 | 14.4 | 7.8 |

2-2. Evaluation of Light-Emission Lifetime

The light-emitting devices of the examples of the invention and the comparative examples continued to be supplied with a constant current of 100 mA/cm² from a DC power supply while their luminances were measured using a luminance meter to measure the time (LT80) at which the luminances decreased to 80% of the initial luminances. For each of the examples of the invention and the comparative examples, the measurement was performed on five light-emitting devices. The results are shown in Table 1.

2-3. Evaluation of Chromaticity

The light-emitting devices of the examples of the invention and the comparative examples were supplied with a constant current of 1 MA/cm² from a DC power supply, and their chromaticities (x,y) were measured using a chromaticity meter. In addition, the light-emitting devices of the examples of the invention and the comparative examples were supplied with a constant current of 50 mA/cm² from a DC power supply, and their chromaticities (x,y) were measured using a chromaticity meter.

Table 1 shows that the light-emitting devices of the examples of the invention showed superior durability while their chromaticity balances and light-emission efficiencies were comparable or superior to those of the light-emitting devices of the comparative examples.

The entire disclosure of Japanese Patent Application No. 2007-260408, filed Oct. 3, 2007 is expressly incorporated by reference herein.

What is claimed is:

1. A light-emitting device comprising:
   a cathode;
   an anode;
   a red light-emitting layer that is disposed between the cathode and the anode and that emits red light;
   a blue light-emitting layer that is disposed between the red light-emitting layer and the cathode and that emits blue light;
   a green light-emitting layer that is disposed between the blue light-emitting layer and the cathode and that emits green light; and
   an intermediate layer that is disposed between and in contact with the red light-emitting layer and the blue light-emitting layer and that functions to prevent energy transfer of excitons between the red light-emitting layer and the blue light-emitting layer,
   the intermediate layer including a first intermediate layer disposed in contact with the red light-emitting layer and mainly containing a first intermediate material and a second intermediate layer disposed in contact with the blue light-emitting layer and mainly containing a second intermediate material different from the first intermediate material, and
   the layers of the light-emitting device are stacked on top of each other such that both the highest occupied molecular orbitals and the lowest unoccupied molecular orbitals of the materials of the layers rise gradually in energy level from the anode side to the cathode side.

2. The light-emitting device according to claim 1, wherein the difference between the energy levels of the highest occupied molecular orbitals of the first intermediate material and the material of the red light-emitting layer is 0.1 to 0.4 eV.

3. The light-emitting device according to claim 1, wherein the difference between the energy levels of the lowest unoccupied molecular orbitals of the second intermediate material and the material of the blue light-emitting layer is 0.1 to 0.4 eV.

4. The light-emitting device according to claim 1, wherein the energy gap between the lowest unoccupied molecular orbital and the highest occupied molecular orbital of the first intermediate material is larger than that of the red light-emitting layer.

5. The light-emitting device according to claim 1, wherein the energy gap between the lowest unoccupied molecular orbital and the highest occupied molecular orbital of the second intermediate material is larger than that of the blue light-emitting layer.

6. The light-emitting device according to claim 1, wherein the first intermediate layer has a higher hole-transportation capability than the second intermediate layer.

7. The light-emitting device according to claim 6, wherein the first intermediate material contains an amine-based hole-transporting material.

8. The light-emitting device according to claim 1, wherein the second intermediate layer has a higher electron-transportation capability than the first intermediate layer.

9. The light-emitting device according to claim 8, wherein the second intermediate material contains an acene-based bipolar material.

10. The light-emitting device according to claim 1, wherein the intermediate layer further includes a third intermediate layer disposed between and in contact with the first intermediate layer and the second intermediate layer and containing a third intermediate material different from the first and second intermediate materials.

11. The light-emitting device according to claim 10, wherein the energy level of the highest occupied molecular orbital of the third intermediate material lies between the energy levels of the highest occupied molecular orbitals of the first and second intermediate materials.

12. The light-emitting device according to claim 10, wherein the energy level of the lowest unoccupied molecular orbital of the third intermediate material lies between the energy levels of the lowest unoccupied molecular orbitals of the first and second intermediate materials.

13. The light-emitting device according to claim 1, wherein the intermediate layer has an average thickness of 100 nm or less.

14. The light-emitting device according to claim 1, wherein the first and second intermediate layers each have an average thickness of 1 to 50 nm.

* * * * *